(12) United States Patent
Kobayashi et al.

(10) Patent No.: US 10,805,554 B2
(45) Date of Patent: Oct. 13, 2020

(54) IMAGING DEVICE AND CAMERA SYSTEM

(71) Applicant: Panasonic Intellectual Property Management Co., Ltd., Osaka (JP)

(72) Inventors: Tsutomu Kobayashi, Osaka (JP); Kazuko Nishimura, Kyoto (JP); Yasuo Miyake, Osaka (JP); Sanshiro Shishido, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 62 days.

(21) Appl. No.: 16/131,270

(22) Filed: Sep. 14, 2018

(65) Prior Publication Data

US 2019/0098224 A1 Mar. 28, 2019

(30) Foreign Application Priority Data

Sep. 28, 2017 (JP) .................. 2017-188375

(51) Int. Cl.
*H04N 5/232* (2006.01)
*H04N 5/235* (2006.01)
(Continued)

(52) U.S. Cl.
CPC ........... *H04N 5/243* (2013.01); *H01L 27/307* (2013.01); *H04N 5/238* (2013.01); *H04N 5/2352* (2013.01);
(Continued)

(58) Field of Classification Search
CPC ........ H04N 5/243; H04N 5/238; H04N 5/351; H04N 5/2352; G02B 5/205; H01L 27/307
See application file for complete search history.

(56) References Cited

U.S. PATENT DOCUMENTS

2007/0076108 A1* 4/2007 Misawa ............ H01L 27/14609
348/294
2013/0277536 A1* 10/2013 Mizuno .............. H04N 5/35563
250/208.1
(Continued)

FOREIGN PATENT DOCUMENTS

JP 2007-104114 4/2007
JP 2011-055345 3/2011
(Continued)

OTHER PUBLICATIONS

The Extended European Search Report dated Jan. 29, 2019 for the related European Patent Application No. 18196139.2.

*Primary Examiner* — Ahmed A Berhan
(74) *Attorney, Agent, or Firm* — McDermott Will & Emery LLP

(57) ABSTRACT

An imaging device includes a photoelectric converter including a pixel electrode, a counter electrode, and a photoelectric conversion layer between the pixel electrode and the counter electrode, the photoelectric conversion layer converting incident light into an electric charge; and a voltage application circuit that applies a first voltage between the pixel electrode and the counter electrode in a first frame and that applies a second voltage between the pixel electrode and the counter electrode in a second frame different from the first frame, the first voltage being a constant voltage, the second voltage being a pulse-shaped voltage.

17 Claims, 26 Drawing Sheets

(51) Int. Cl.
*H04N 5/238* (2006.01)
*H04N 5/351* (2011.01)
*H01L 27/30* (2006.01)
*G02B 5/20* (2006.01)
*H04N 5/225* (2006.01)
*H04N 9/04* (2006.01)
*H04N 9/73* (2006.01)
*H04N 5/243* (2006.01)

(52) U.S. Cl.
CPC ............. *H04N 5/351* (2013.01); *G02B 5/205* (2013.01); *H04N 5/2254* (2013.01)

(56) References Cited

U.S. PATENT DOCUMENTS

2014/0307159 A1   10/2014   Takagi
2016/0119562 A1*  4/2016   Takase .................. H04N 5/353
                                                                  348/230.1
2016/0360134 A1   12/2016   Miyake

FOREIGN PATENT DOCUMENTS

| JP | 2013-088596 | 5/2013 |
| JP | 2017-005051 | 1/2017 |
| WO | 2012/086123 | 6/2012 |

\* cited by examiner

FIG. 8

| | FIRST ELECTRONIC ND FILTER | SECOND ELECTRONIC ND FILTER |
|---|---|---|
| PATTERN 1 | AUTOMATIC CONTROL FIXED | AUTOMATIC CONTROL FIXED |
| PATTERN 2 | AUTOMATIC CONTROL FIXED | AUTOMATIC/MANUAL CONTROL SWITCHING |
| PATTERN 3 | AUTOMATIC CONTROL FIXED | MANUAL CONTROL FIXED |
| PATTERN 4 | AUTOMATIC/MANUAL CONTROL SWITCHING | AUTOMATIC CONTROL FIXED |
| PATTERN 5 | AUTOMATIC/MANUAL CONTROL SWITCHING | AUTOMATIC/MANUAL CONTROL SWITCHING |
| PATTERN 6 | AUTOMATIC/MANUAL CONTROL SWITCHING | MANUAL CONTROL FIXED |
| PATTERN 7 | MANUAL CONTROL FIXED | AUTOMATIC CONTROL FIXED |
| PATTERN 8 | MANUAL CONTROL FIXED | AUTOMATIC/MANUAL CONTROL SWITCHING |
| PATTERN 9 | MANUAL CONTROL FIXED | MANUAL CONTROL FIXED |

IMAGING DEVICE AND CAMERA SYSTEM

BACKGROUND

1. Technical Field

The present disclosure relates to an imaging device and a camera system that can electrically change sensitivity.

2. Description of the Related Art

In recent years, when adjusting illuminance, a so-called electronic neutral density (ND) filter has been proposed as well as an aperture and a shutter (see, for example, Japanese Unexamined Patent Application Publication No. 2013-88596). In this method, a voltage is applied to set transmittance corresponding to illuminance, and the illuminance is electrically adjusted.

SUMMARY

One non-limiting and exemplary embodiment provides an imaging device that can more finely adjust sensitivity with respect to a change in brightness.

In one general aspect, the techniques disclosed here feature an imaging device including: a photoelectric converter including a pixel electrode, a counter electrode, and a photoelectric conversion layer between the pixel electrode and the counter electrode, the photoelectric conversion layer converting incident light into an electric charge; and a voltage application circuit that applies a first voltage between the pixel electrode and the counter electrode in a first frame and that applies a second voltage between the pixel electrode and the counter electrode in a second frame different from the first frame, the first voltage being a constant voltage, the second voltage being a pulse-shaped voltage.

A comprehensive or specific aspect may be realized by an element, a device, a module, a system, an integrated circuit, or a method. A comprehensive or specific aspect may be realized by any combination of the element, the device, the module, the system, the integrated circuit, and the method.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 8 is a table illustrating control patterns of a first conversion unit and a second conversion unit in the modification 1 of the first embodiment;

DETAILED DESCRIPTION

Figure 1:
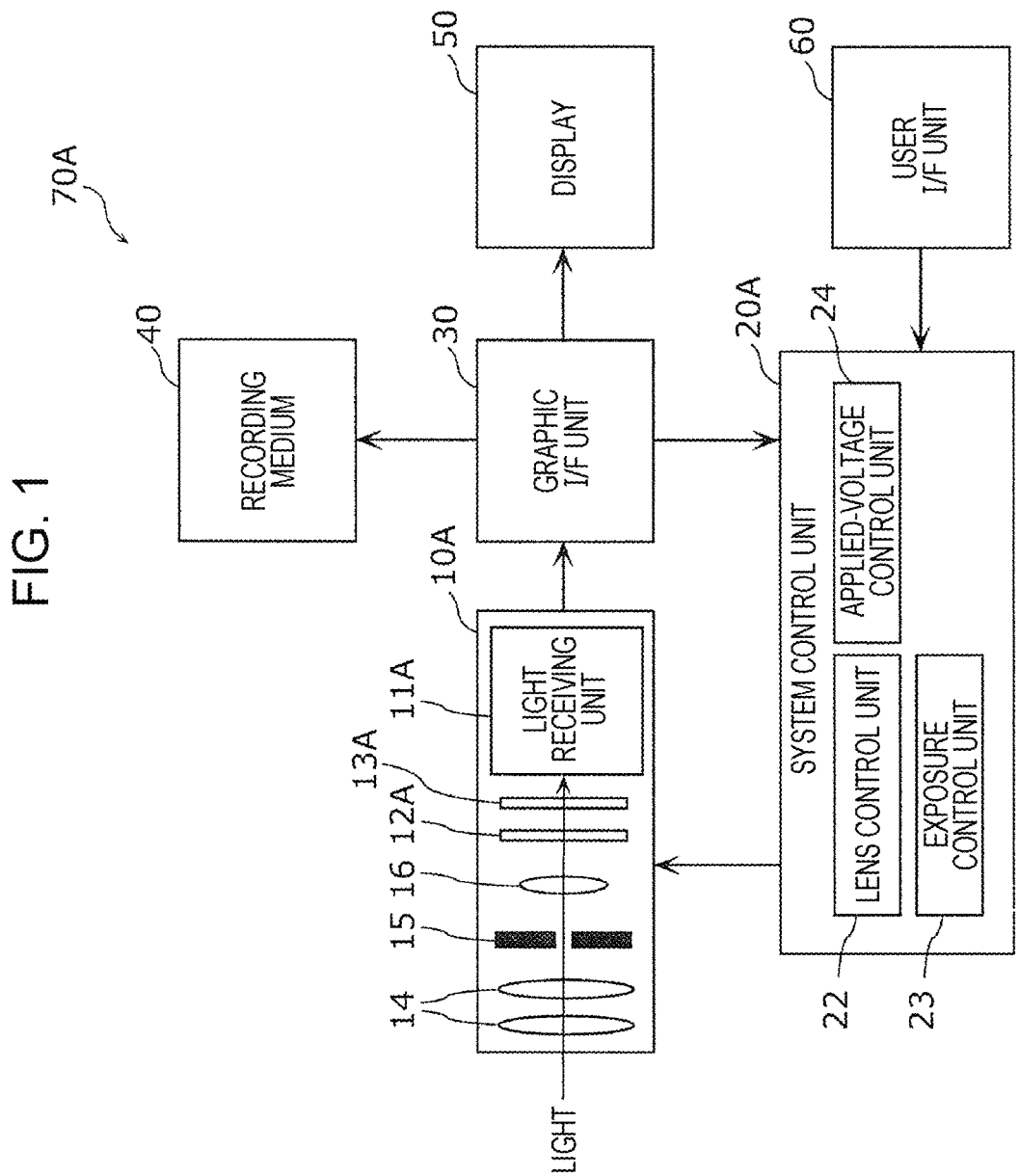
FIG. 1 is a functional block diagram illustrating the configuration of a camera system according to a first embodiment.

It is known that an electronic ND filter can uniformly control the brightness of a captured image compared with an aperture. The electronic ND filter can reduce deterioration in image quality because a diffraction phenomenon seen in the aperture does not occur. However, it is requested that sensitivity can be more finely adjusted with respect to a change in brightness. The present disclosure provides an imaging device that can more finely adjust sensitivity with respect to a change in brightness.

An overview of an aspect of the present disclosure is as described below.

[Item 1]

An imaging device including:
a photoelectric converter including a pixel electrode, a counter electrode, and a photoelectric conversion layer between the pixel electrode and the counter electrode, the photoelectric conversion layer converting incident light into an electric charge; and
a voltage application circuit that applies a first voltage between the pixel electrode and the counter electrode in a first frame and that applies a second voltage between the pixel electrode and the counter electrode in a second frame different from the first frame, the first voltage being a constant voltage, the second voltage being a pulse-shaped voltage.

[Item 2]

An imaging device including:
a photoelectric converter including a photoelectric conversion layer that includes a first surface and a second surface opposite to the first surface and that converts incident light into an electric charge, a pixel electrode on the first surface, a counter electrode on the second surface, and an auxiliary electrode on the second surface; and
a voltage application circuit that applies a first voltage between the pixel electrode and the auxiliary electrode in a first frame and that applies a second voltage between the pixel electrode and the auxiliary electrode in a second frame different from the first frame, the first voltage being a constant voltage, the second voltage being a pulse-shaped voltage.

[Item 3]

The imaging device according to Item 1 or 2, wherein the voltage application circuit applies either the first voltage or the second voltage according to an ND value set for each frame.

[Item 4]

The imaging device according to Item 3, wherein the voltage application circuit applies the first voltage in a frame set to an ND value equal to or larger than a first value, and applies the second voltage in a frame set to an ND value smaller than the first value.

[Item 5]

The imaging device according to Item 4, wherein the voltage application circuit applies, in the frame set to the ND value equal to or larger than the first value, the first voltage having a voltage value corresponding to the ND value.

[Item 6]

The imaging device according to Item 4 or 5, wherein the voltage application circuit applies, in the frame set to the ND value smaller than the first value, the second voltage having a duty cycle corresponding to the ND value.

[Item 7]

The imaging device according to Item 4 or 5, wherein the voltage application circuit applies, in the frame set to the ND value smaller than the first value, the second voltage having a voltage value corresponding to the ND value and a duty cycle corresponding to the ND value.

[Item 8]

The imaging device according to any one of Items 1 to 7, further including a controller that switches an automatic mode for changing, according to intensity of the incident light, a voltage applied between the pixel electrode and the counter electrode by the voltage application circuit, and a manual mode for changing, according to an instruction from a user, a voltage applied between the pixel electrode and the counter electrode by the voltage application circuit.

[Item 9]

A camera system including:
the imaging device according to claim 1;
a display; and
a graphic interface unit that causes the display to selectively display a first image for receiving an instruction for continuously changing a sensitivity and a second image for receiving an instruction for changing a sensitivity stepwise.

An overview of another aspect of the present disclosure is as described below.

A camera system according to an aspect of the present disclosure includes a light receiving unit that converts incident light into an electric signal, a first conversion unit and a second conversion unit that change, according to an applied voltage, a gain in a process from incidence of the incident light until the conversion of the incident light into the electric signal by the light receiving unit, and an applied-voltage control unit that applies a voltage to the first conversion unit and the second conversion unit. The second conversion unit is disposed in a position where light passed through the first conversion unit is made incident.

Because the camera system includes the two conversion units in this way, the conversion units can change the gain independently from each other. Therefore, sensitivity can be more finely adjusted with respect to a change in brightness. Because the camera system includes the two conversion units, the two conversion units perform the change of the gain performed by one conversion unit. Therefore, the size of one conversion unit can be reduced. Further, because the applied voltage for controlling the respective conversion units can be reduced, the change of the gain can be performed at higher speed than when the camera system includes only one conversion unit.

For example, in the camera system according to the aspect of the present disclosure, the first conversion unit may be a filter that changes the gain by attenuating a light amount of the incident light according to the applied voltage, the second conversion unit may be a filter on which the light passed through the first conversion unit is made incident and that changes the gain by attenuating the light amount of the incident light according to the applied voltage, and the light receiving unit may receive the light passed through the second conversion unit as the incident light and convert the incident light into the electric signal.

Consequently, the sensitivity can be more finely adjusted with respect to the change in the brightness simply by, for example, adding another electronic ND filter to a normal imaging device including only one electronic ND filter.

For example, in the camera system according to the aspect of the present disclosure, the first conversion unit and the second conversion unit may be filters having different types of neutral density (ND) mechanisms.

Consequently, the light amount of the incident light can be adjusted making use of merits of the different types of the ND mechanisms.

For example, in the camera system according to the aspect of the present disclosure, the first conversion unit may be a filter that changes the gain by attenuating a light amount of the incident light according to the applied voltage, the light receiving unit may include a second light amount conversion layer that receives light passed through the first conversion unit as the incident light and converts the incident light into the electric signal and two second electrodes that sandwich the second photoelectric conversion layer, and the second photoelectric conversion layer may function as the second conversion unit and change the gain by changing, according to the applied voltage, quantum efficiency in converting the incident light into the electric signal.

Consequently, a function of an electronic ND filter can be realized by the light receiving unit. Therefore, the camera system can be made compact compared with when two electronic ND filters are disposed.

For example, in the camera system according to the aspect of the present disclosure, the light receiving unit may include a first photoelectric conversion layer that converts the incident light into the electric signal and two first electrodes that sandwich the first photoelectric conversion layer and a second photoelectric conversion layer that receives light passed through the first conversion unit as the incident light and converts the incident light into the electric signal and two second electrodes that sandwich the second photoelectric conversion layer, the first photoelectric conversion layer may function as the first conversion unit and change the gain by changing, according to the applied voltage, quantum efficiency in changing the incident light into the electric signal, and the second photoelectric conversion layer may function as the second conversion unit and change the gain by changing, according to the applied voltage, the quantum efficiency in converting the incident light into the electric signal.

Because the first conversion unit and the second conversion unit are provided in the light receiving unit in this way, functions of two electronic ND filters can be realized by the light receiving unit. Therefore, the camera system can be made more compact than when an electronic ND filter is provided separately from the light receiving unit.

For example, in the camera system according to the aspect of the present disclosure, the applied-voltage control unit may change, according to the quantum efficiency, a duty cycle of a pulse voltage applied to the second photoelectric conversion layer.

Consequently, for example, the gain can be changed by changing the duty cycle of the applied voltage.

For example, the camera system according to the aspect of the present disclosure may further include an automatic/manual control unit that switches an automatic mode for changing, according to intensity of the incident light, the voltage applied by the applied-voltage control unit and a manual mode for changing, according to an instruction from a user, the voltage applied by the applied-voltage control unit.

Consequently, the user can freely select a desired mode according to a photographing situation.

For example, the camera system according to the aspect of the present disclosure may further include a white-balance control unit that adjusts, according to a voltage applied to the second photoelectric conversion layer, a white balance with respect to the electric signal converted by the light receiving unit.

Consequently, because the white balance is kept even if the applied voltage is changed, a balanced image can be obtained.

For example, in the camera system according to the aspect of the present disclosure, the light receiving unit may further include a third electrode for applying a voltage to the second photoelectric conversion layer, and the applied-voltage control unit may change, according to the quantum efficiency, a voltage applied to the third electrode.

Because the camera system includes the third electrode in this way, the quantum efficiency can be adjusted simply by adjusting the voltage of the third electrode.

For example, in the camera system according to the aspect of the present disclosure, at least one of the first conversion unit and the second conversion unit may change a characteristic of a frequency filter according to the applied voltage.

Because the camera system includes the frequency filter in this way, light in a specific wavelength region can be selectively caused to pass and an image having a desired tone can be obtained.

For example, the camera system according to the aspect of the present disclosure may further include a display and a graphic interface unit that switches and displays, on the display, a first image for receiving an instruction for continuously changing the gain and a second image for receiving an instruction for changing the gain stepwise.

Consequently, a desired user interface can be realized.

Note that these comprehensive or specific aspects may be realized by a system, a method, an integrated circuit, a computer program, or a computer-readable recording medium such as a CD-ROM or may be realized by any combination of the system, the method, the integrated circuit, the computer program, and the recording medium.

Embodiments of the present disclosure are specifically explained below with reference to the drawings.

However, detailed explanation more than necessary is sometimes omitted. For example, detailed explanation of already well-known matters and redundant explanation concerning substantially the same components are sometimes omitted. This is to prevent the following explanation from becoming unnecessarily redundant and facilitate understanding of those skilled in the art. Note that the accompanying drawings and the following explanation are for those skilled in the art to sufficiently understand the present disclosure. The accompanying drawings and the following explanation are not intended to limit the subject described in the claims.

Note that, in the drawings, elements representing substantially the same configurations, operations, and effects are denoted by the same reference numerals and signs. All numerical values described below are illustrated to specifically explain the present disclosure. The present disclosure is not limited by the illustrated numerical values. Further, a connection relation among constituent elements is illustrated to specifically explain the present disclosure. A connection relation for realizing the functions of the present disclosure is not limited to this connection relation.

A camera system according to an aspect of the present disclosure includes a light receiving unit that converts incident light into an electric signal, a first conversion unit and a second conversion unit that change, according to an applied voltage, a gain in a process from incidence of the incident light until the conversion of the incident light into the electric signal by the light receiving unit, and an applied-voltage control unit that applies a voltage to the first conversion unit and the second conversion unit. The second conversion unit is disposed in a position where light passed through the first conversion unit is made incident. For example, the camera system is a camera that captures a moving image and a still image.

In the present disclosure, the light receiving unit is an imaging element or an imaging device. The light receiving unit may be, for example, a laminated organic solid-state imaging device or may be a photodiode.

The first conversion unit and the second conversion unit change the gain by changing the applied voltage in the process from the incidence of the incident light until the conversion of the incident light into the electric signal by the light receiving unit. The gain in the process from the incidence of the incident light until the conversion of the incident light into the electric signal by the light receiving unit includes not only a conversion ratio for converting the incident light into the electric signal but also a conversion ratio from light into light, that is, an attenuation ratio for attenuating a light amount of the incident light. For example, as an example in which the gain is reduced, when the camera system receives strong light such as direct sunlight, by attenuating the light amount of the incident light, an excessively large voltage is prevented from being generated in the light receiving unit. As an example in which the gain is changed, by changing quantum efficiency in converting the incident light into the electric signal, light sensitivity of the light receiving unit can be adjusted.

Because the camera system of the present disclosure has the configuration explained above, the sensitivity of the conversion unit can be more finely adjusted with respect to a change in brightness.

As specific examples, a first embodiment to a fourth embodiment are explained blow.

First Embodiment

An overview of a camera system according to a first embodiment of the present disclosure is explained below. FIG. 1 is a functional block diagram illustrating the configuration of a camera system 70A according to this embodiment.

In the camera system 70A according to this embodiment, a first conversion unit 12A is a filter that changes a gain by attenuating a light amount of incident light according to an applied voltage. A second conversion unit 13A is a filter on which light passed through the first conversion unit 12A is made incident and that changes the gain by attenuating a light amount of the incident light according to the applied voltage. A light receiving unit 11A may receive the light passed through the second conversion unit 13A as incident light and convert the incident light into an electric signal.

As illustrated in FIG. 1, the camera system 70A according to this embodiment includes an imaging unit 10A that images an object, a graphic interface unit (hereinafter referred to as graphic I/F unit) 30 that processes an electric signal output from the imaging unit 10A, a system control unit 20A that controls operations of components in the imaging unit 10A, a recording medium 40 that stores image data processed by the graphic I/F unit 30, a display 50 that displays an image, and a user interface unit (hereinafter referred to as user I/F unit) 60 that transmits an input instruction from a user to the system control unit 20A.

The imaging unit 10A includes, in order from a side on which light is made incident on the imaging unit 10A, a lens 14, a mechanical shutter 15, a focus lens 16, the first conversion unit 12A, the second conversion unit 13A, and the light receiving unit 11A. That is, the first conversion unit 12A and the second conversion unit 13A are provided separately from the light receiving unit 11A. The second conversion unit 13A is disposed in a position where light passed through the first conversion unit 12A is made incident.

The first conversion unit 12A in this embodiment is a filter that attenuates a light amount of incident light according to an applied voltage to thereby change a gain in a process from incidence of the incident light until conversion of the incident light into an electric signal by the light receiving unit 11A. The first conversion unit 12A is a so-called electronic ND filter.

The second conversion unit 13A is a filter on which the light passed through the first conversion unit 12A is made incident and that attenuates a light amount of the incident light according to the applied voltage to thereby change a gain in a process from the incidence of the incident light until conversion of the incident light into an electric signal by the light receiving unit 11A. The second conversion unit 13A is a so-called electronic ND filter.

That is, the camera system 70A according to this embodiment includes the first conversion unit (a first electronic ND filter) 12A and the second conversion unit (a second electronic ND filter) 13A capable of changing sensitivity according to the applied voltage.

Note that, in FIG. 1, an example is illustrated in which the camera system 70A includes two electronic ND filters of the first electronic ND filter 12A and the second electronic ND filter 13A. However, the camera system 70A may include three or more electronic ND filters.

In this embodiment, the light receiving unit 11A is a so-called imaging element that receives light passed through the second conversion unit 13A as incident light and converts the incident light into an electric signal. In this embodiment, the light receiving unit 11A may be configured from, for example, a laminated solid-state imaging element including a photoelectric conversion film that performs photoelectric conversion according to incident light. The photoelectric conversion film may include, for example, amorphous silicon. Note that the light receiving unit 11A may be an imaging device such as a charge coupled device (CCD) image sensor or a complementary metal oxide semiconductor (CMOS) image sensor.

Further, the camera system 70A according to this embodiment may further include the display 50 and the graphic I/F unit 30 that switches and displays, on the display 50, a first image 60a for receiving an instruction for continuously changing the gain and a second image 60b for receiving an instruction for changing the gain stepwise.

The display 50 is a display device that displays an image and is, for example, a liquid crystal (LC) display or an organic electro luminescence (EL) display.

The graphic I/F unit 30 receives digitally processed imaging data output from the light receiving unit 11A, compresses the imaging data in a predetermined compression scheme such as a JPEG format, and stores the compressed imaging data in the recording medium 40. The recording medium 40 is a nonvolatile memory and is, for example, a flash memory.

The graphic I/F unit 30 reduces the digitally processed imaging data to an image size adjusted to a size of the display 50 and displays the imaging data on the display 50.

The graphic I/F unit 30 transmits, to the system control unit 20A, a result of a feature value calculated from the digitally processed imaging data output from the light receiving unit 11A. The feature value is information indicating a characteristic of an image and is, for example, a numerical value representing a defocus amount, an exposure amount, a tone, or the like of the image.

The system control unit 20A receives the feature value of the imaging data calculated by the graphic I/F unit 30 and determines an appropriate imaging condition from the feature value. The system control unit 20A transmits a control signal to the imaging unit 10A based on the determined imaging condition.

The system control unit 20A in this embodiment includes a lens control unit 22, an exposure control unit 23, and an applied-voltage control unit 24.

The lens control unit 22 controls, based on the defocus amount calculated by the graphic I/F unit 30, a position to which the focus lens 16 is moved. In FIG. 1, the imaging unit 10A includes only one focus lens 16. However, the imaging unit 10A may include a plurality of focus lenses 16. When the imaging unit 10A includes the plurality of focus lenses 16, the focus lenses 16 are less easily affected by an aberration. A focus can be more finely adjusted.

The exposure control unit 23 controls an aperture value and shutter speed of the mechanical shutter 15 based on the exposure amount calculated by the graphic I/F unit 30. The mechanical shutter 15 adjusts a light amount (illuminance) of light made incident on the imaging unit 10A.

The applied-voltage control unit 24 controls an applied voltage to the first conversion unit 12A (e.g., a variable transmittance dimming filter) and the second conversion unit 13A based on the feature value of the imaging data calculated by the graphic I/F unit 30. Consequently, the applied-voltage control unit 24 adjusts a conversion ratio from light into light in the first conversion unit 12A and the second conversion unit 13A, that is, an attenuation ratio of a light amount.

Note that the system control unit 20A may include an electronic-shutter control unit that controls start timing of charge accumulation of the light receiving unit 11A. In embodiments and modifications explained below, similarly, a system control unit may include an electronic-shutter control unit.

The user interface (user I/F) unit 60 includes an operation unit that receives operation from the user and transmits an operation signal received from the user to the system control unit 20A. The user I/F unit 60 is, for example, a touch panel, a dial, or a push button. The touch panel is disposed on the display 50. The touch panel detects a position touched by a finger of the user on the touch panel and transmits position information to the system control unit 20A. The user can easily designate desired setting parameters by operating the touch panel while confirming display items such as setting parameters displayed on the display 50.

Figure 2:
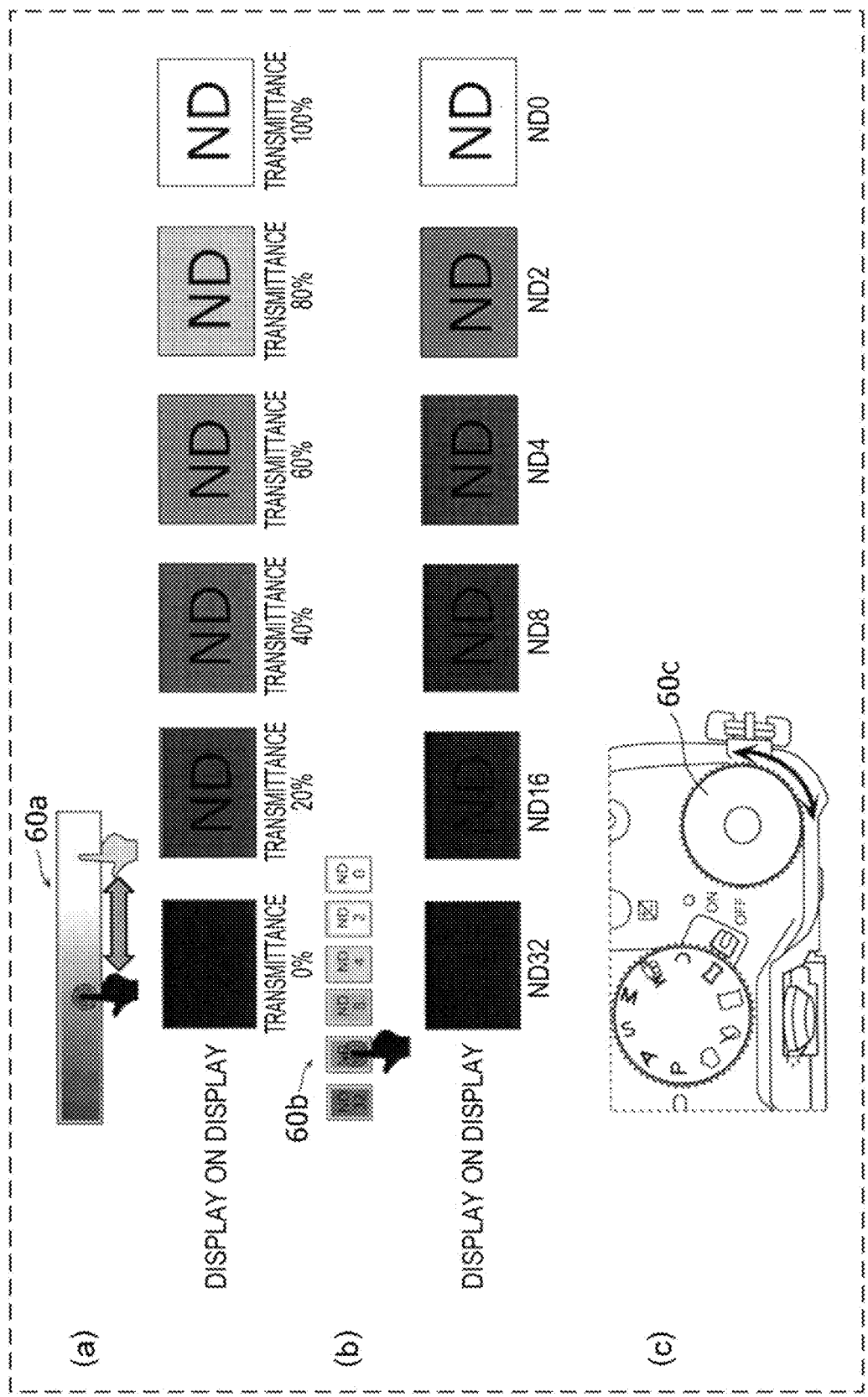
FIG. 2 is diagram illustrating an example of a user I/F unit.

The user I/F unit 60 is explained with reference to a specific example. FIG. 2 is diagram illustrating an example of the user I/F unit 60.

As illustrated in FIG. 2, as means for the user to change setting of an ND value, there are a touch type in which the user designates a parameter displayed on the display 50 and a mechanical type in which the user designates the parameter with a dial, a push button, and the like. There are multistage control in which the parameter can be adjusted in multiple stages and no-stage control in which the parameter can be continuously adjusted. The parameter is the ND value.

In the touch type no-stage ND control illustrated in FIG. 2(a), a bar indicating gradation of the ND value, which is the first image 60a, is displayed on the display 50. When the user traces, with a finger, the bar 60a indicating the gradation of the ND value displayed on the display 50, the touch panel detects the position of the finger that traces the bar 60a. The touch panel transmits information concerning the detected position of the finger to the system control unit 20A. Consequently, the user can instruct the system control unit 20A to change the ND value to a desired ND value. At this time, when the user traces, with the finger, the bar indicating the gradation of the ND value of the first image 60a, an image corresponding to transmittance touched by the finger is displayed on the display 50.

In the touch type multistage ND control illustrated in FIG. 2(b), icons indicating ND values in stages, which are the second image 60b, are displayed on the display 50. When the user touches, with a finger, the icon 60b indicating the ND values in the multiple stages displayed on the display 50 and selects the icon 60b, the touch panel detects a position touched by the finger. The touch panel transmits information concerning the detected position of the finger to the system control unit 20A. Consequently, the user can instruct the system control unit 20A to change the ND value to the desired ND value. At this time, when the user touches, with the finger, the icon indicating the ND value in each stage, which is the second image 60b and selects the icon, an image corresponding to the ND value touched by the finger is displayed on the display 50.

In the mechanical multistage ND control illustrated in FIG. 2(c), the user can instruct the system control unit 20A to change the ND value to the desired ND value by turning a dial 60c disposed in a camera body.

In all the cases explained above, because the user can adjust the ND value while viewing the image displayed on the display 50, it is possible to more finely and quickly perform sensitivity adjustment continuously or in multiple stages. Consequently, it is possible to prevent the display of the display 50 from suddenly changing according to a sudden change of exposure. Therefore, it possible to reduce, for example, fatigue of the eyes of the user.

Figure 3:
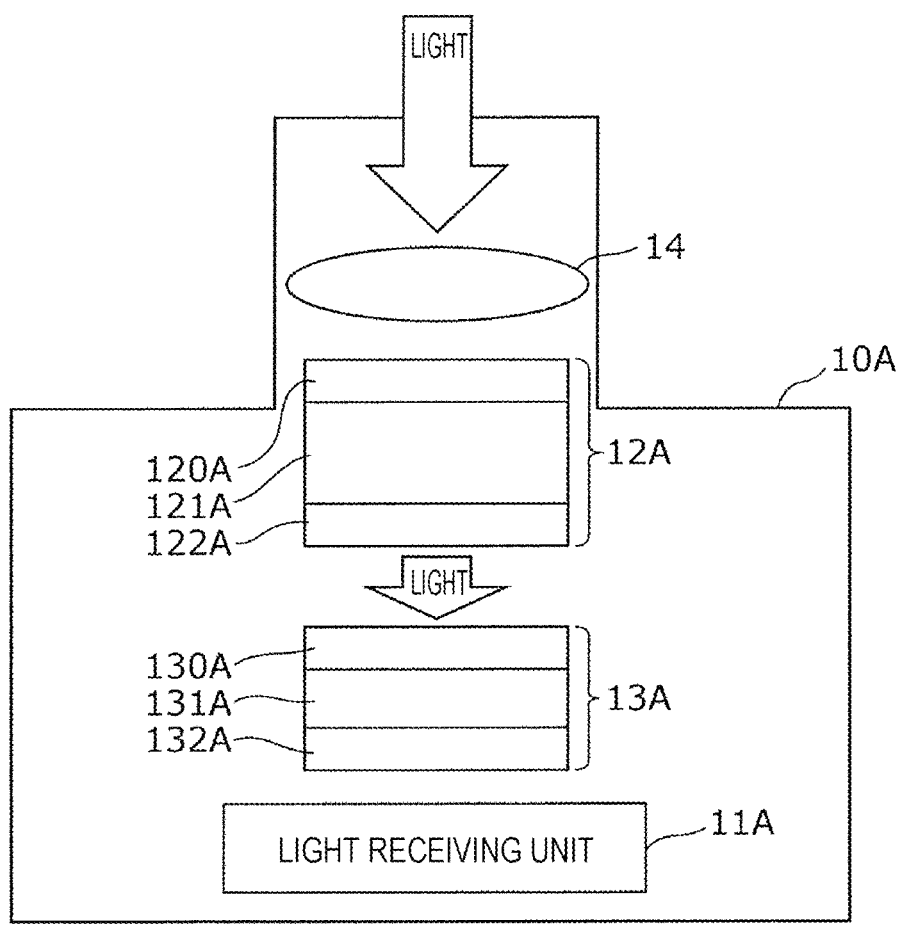
FIG. 3 is a diagram for explaining the configuration of a first conversion unit and a second conversion unit in the camera system according to the first embodiment.

Subsequently, an ND mechanism in the camera system 70A according to this embodiment is explained in detail with reference to FIG. 3. FIG. 3 is a diagram for explaining the configuration of the first conversion unit 12A and the second conversion unit 13A in the camera system 70A according to the first embodiment. Note that, in FIG. 3, only components necessary for explaining the ND mechanism are described. In this embodiment, both of the first conversion unit 12A and the second conversion unit 13A are electronic ND filters. In the following explanation, in this embodiment, the first conversion unit 12A and the second conversion unit 13A are respectively referred to as first electronic ND filter 12A and second electronic ND filter 13A.

As illustrated in FIG. 3, incident light is made incident on the imaging unit 10A through the lens 14. The light made incident on the imaging unit 10A passes through the first electronic ND filter 12A and thereafter passes through the second electronic ND filter 13A. Consequently, the light made incident on the imaging unit 10A is attenuated to a desired light amount and is made incident on the light receiving unit 11A.

The first electronic ND filter 12A includes a pair of electrodes 120A and 122A and a first ND filter layer 121A sandwiched by the pair of electrodes 120A and 122A. The second electronic ND filter 13A includes a pair of electrodes 130A and 132A and a second ND filter layer 131A sandwiched by the pair of electrodes 130A and 132A.

In the camera system 70A according to this embodiment, the first electronic ND filter 12A and the second electronic ND filter 13A may be filters including different types of ND mechanisms.

For example, the first electronic ND filter 12A is a liquid crystal-type electronic ND filter including a liquid crystal layer as the first ND filter layer 121A. The second electronic ND filter 13A is a precipitation-type electronic ND filter including a reactant layer as the second ND filter layer 131A.

Figure 4:
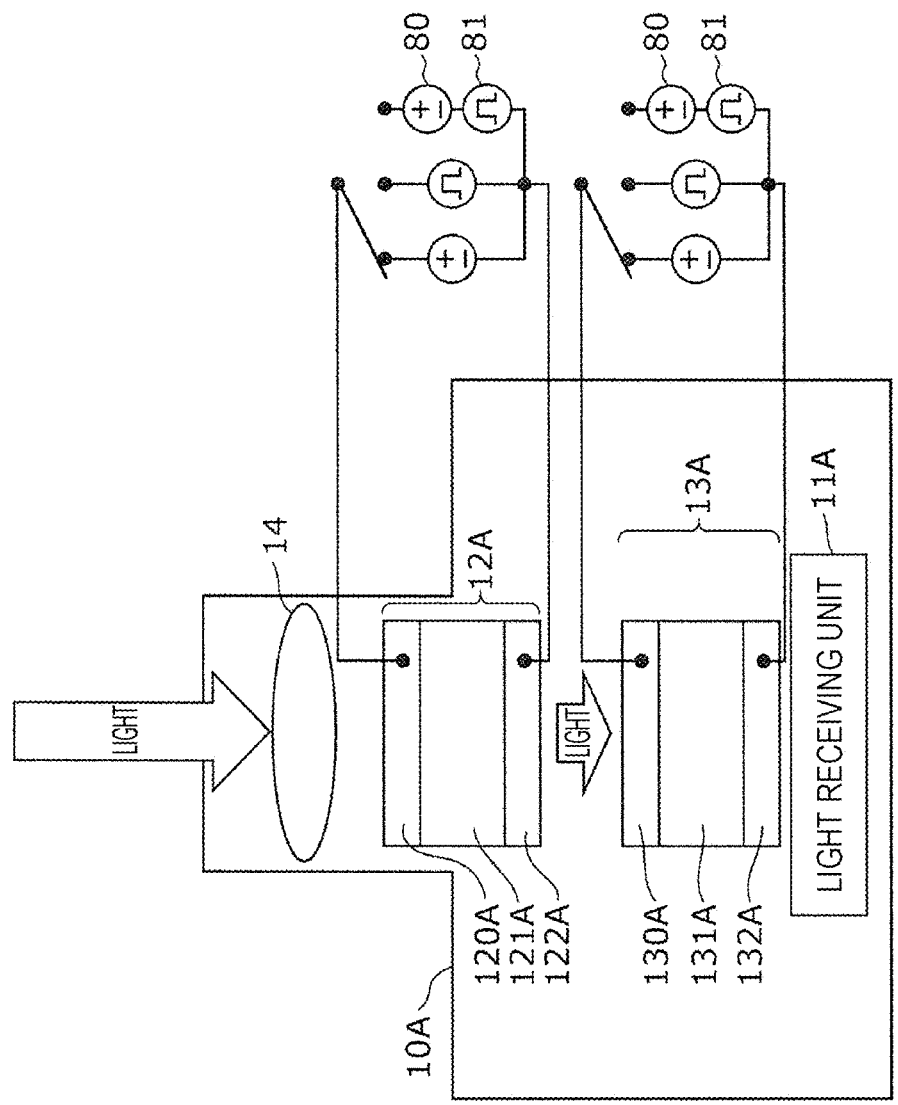
FIG. 4 is a diagram for explaining a sensitivity adjusting method of the first conversion unit and the second conversion unit in the camera system according to the first embodiment.

A sensitivity adjusting method of the first electronic ND filter 12A and the second electronic ND filter 13A is explained. FIG. 4 is a diagram for explaining a sensitivity adjusting method of the first electronic ND filter 12A and the second electronic ND filter 13A in the camera system 70A according to this embodiment. A voltage power supply 80 illustrated in FIG. 4 is a power supply that applies a voltage to an electrode of a filter. A pulse-duty-voltage power supply 81 is a power supply that applies a voltage converted into a pulse voltage to the electrode of the filter.

The first electronic ND filter 12A is the liquid crystal-type electronic ND filter. The second electronic ND filter 13A is the precipitation-type electronic ND filter. These electronic ND filters change the transmittance of light by adjusting an applied voltage with the voltage power supply 80. Because liquid crystal includes a dimming material that absorbs light, the liquid crystal-type electronic ND filter adjusts the applied voltage to thereby change a tilt of liquid crystal molecules and change a degree of dimming, that is, the transmittance of light. In the precipitation-type electronic ND filter, a reaction solution including a reactant that reversibly performs oxidation-reduction reaction is filled on the inside of a cell, on the inner surface of which an electrode is provided. The precipitation-type electronic ND filter adjusts the applied voltage to thereby control the oxidation-reduction reaction of the reactant in the cell. More specifically, the precipitation-type electronic ND filter adjusts the applied voltage, whereby silver chloride, which is the reactant, causes the oxidation-reduction reaction and precipitates or dissolves silver in the reaction solution.

It is known that, although the liquid crystal-type and the precipitation-type electronic ND filters can uniformly change the transmittance of light, response speed to a light amount change of incident light is relatively low. However, as in the camera system 70A according to this embodiment, by using the two electronic ND filters in combination, the respective electronic ND filters can further reduce an attenuated light amount than when one electronic ND filter is used. Therefore, in this embodiment, a response time until incident light is attenuated to a desired light amount can be reduced to approximately ½ times compared with when the camera system 70A includes only one electronic ND filter. That is, in response to a sudden change in an exposure amount of an object, response speed until the electronic ND filter changes to light transmittance for attenuating the incident light to the desired light amount can be reduced.

Note that the ND mechanism illustrated in FIGS. 3 and 4 is an example. The ND mechanism in the present disclosure may be configured from two or more electronic ND filters. In this embodiment, an example is explained in which the respective electronic ND filters have different configurations such as the liquid crystal type and the precipitation type. However, all of the two or more electronic ND filters may have the same configuration and may be configured by any combination.

In this embodiment, the camera system 70A may include a filter having characteristic other than the characteristics of the liquid crystal-type and the precipitation-type electronic ND filters. For example, in the camera system 70A according to this embodiment, in at least one of the first electronic ND filter 12A and the second electronic ND filter 13A, a characteristic of the first electronic ND filter 12A and the second electronic ND filter 13A functioning as a frequency filter may be changed according to an applied voltage. The frequency filter is explained below.

Figure 5:
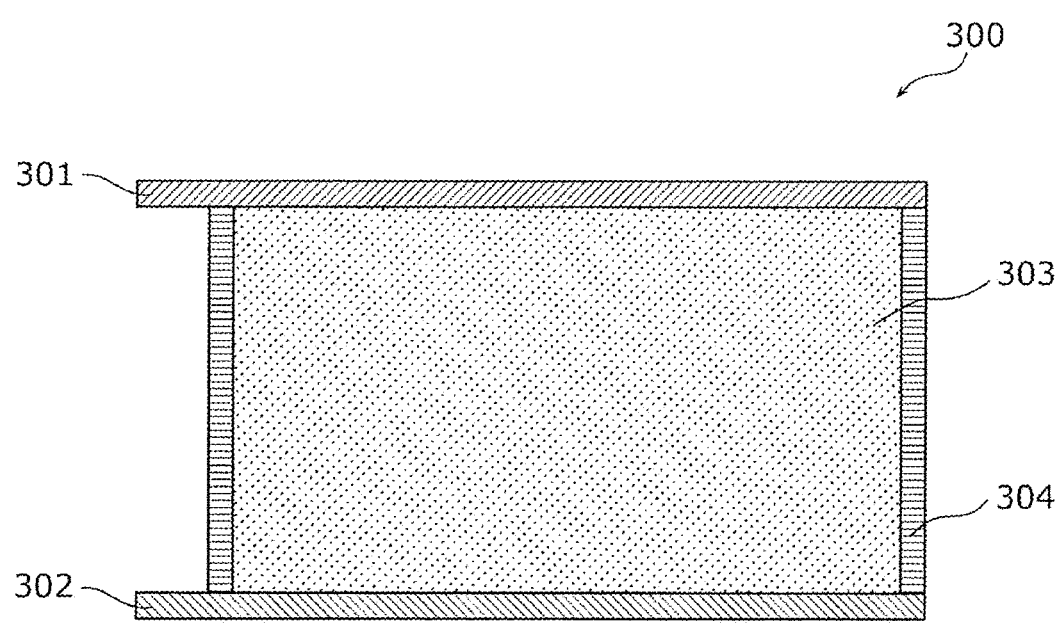
FIG. 5 is a schematic sectional view of a frequency filter.

FIG. 5 is a schematic sectional view of a frequency filter 300. The frequency filter 300 includes an electrode pair including an anode 301 and a cathode 302 as a pair, a filter layer 303 sandwiched by the electrode pair, and a spacer 304 that surrounds the outer periphery of a filter layer to seal the filter layer while retaining an interval between the electrode pair.

The filter layer 303 is disposed in a closed space surrounded by the electrode pair and the spacer 304. The filter layer 303 includes a substance, a tone and a color of which change when a voltage is applied to the electrode pair. In general, such a color change is called electrochromism and is a reversible change of a tone and a color of a substance caused by electrochemical oxidation-reduction reaction. That is, the color change is caused because an oxidation-reduction state of molecules and metal ions included in the substance changes and an absorption band of light changes. The object showing such electrochromism is called electrochromic substance. Note that the electrochromic substance is explained below.

When a constituent material of an electrolyte layer including the electrochromic substance is liquid or gel, the constituent material may be sealed by, for example, a conducive film and disposed between electrodes or may be directly injected into a space sealed by the electrode pair and the spacer. When the constituent material of the electrolyte layer including the electrochromic substance is a solid state such as a powder state, a particle state, a film state, a layer state, or a plate state, the constituent material may be molded by press or may be kneaded with resin or the like and molded. The constituent material only has to be molded in a state without fluidity generally called solid state. In this case, the spacer 304 that seals the filter layer 303 between the electrode pair may be present or may be absent.

As explained above, the tone and the color of the frequency filter 300 change when the applied voltage to the frequency filter 300 is adjusted. A mechanism for causing the color change is the reversible oxidation-reduction reaction of the electrochromic substance in the electrode pair. Decoloring and coloring can be switched by adjusting an applied voltage to the electrode pair.

The anode 301 and the cathode 302 are desirably transparent electrodes. Consequently, light transmitted through the frequency filter 300 can be made incident on the light receiving unit 11A. Note that the transparent electrode only has to be a transparent electrode used in general. A specific material and a definition of transparency are explained below in explanation of a counter electrode in a second embodiment.

The electrochromic substance is specifically explained. The electrochromic substance is present in both of an organic compound and an inorganic compound. When the electrochromic substance is the organic compound and a voltage is applied to the electrode pair, molecules change to other substances according to the oxidation-reduction reaction or changes to a radical state, whereby a color of the electrochromic substance changes. When the electrochromic substance is the inorganic compound and a voltage is applied to the electrode pair, the molecules change according to the oxidation-reduction reaction, whereby the color of the electrochromic substance changes. Examples of the inorganic compound include pentacarbonyl ferrate. The pentacarbonyl ferrate is colored in blue during oxidation and is colorless during reduction. Nickel oxide (NiOx) is brown during oxidation and is colorless during reduction. These inorganic compounds are an oxidation color development type. Examples of the organic compound include heptyl viologen. The heptyl viologen is colored in purple during reduction and is colorless during oxidation. That is, the heptyl viologen is a reduction color development type.

Subsequently, a frequency characteristic of the frequency filter 300 is explained. FIGS. 6A to 6D are graphs for explaining the frequency characteristic of the frequency filter 300. In FIGS. 6A to 6D, the vertical axis indicates an output and the horizontal axis indicates a wavelength of light transmitted through a filter.

Figure 6A:
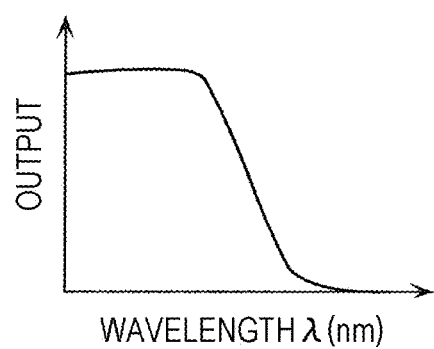
FIGS. 6A to 6D are graphs for explaining frequency characteristics of the frequency filter.

FIG. 6A is a graph illustrating a frequency characteristic of a high-pass filter having high transmittance for only light having a wavelength in a short wavelength region, that is, a high frequency. In the high-pass filter, the pentacarbonyl ferrate is used as the electrochromic substance. As explained above, the pentacarbonyl ferrate is colored in blue when being oxidized. Therefore, as illustrated in FIG. 6A, the high-pass filter increases transmittance only for light having a wavelength in a short wavelength region including a wavelength of blue.

Figure 6C:
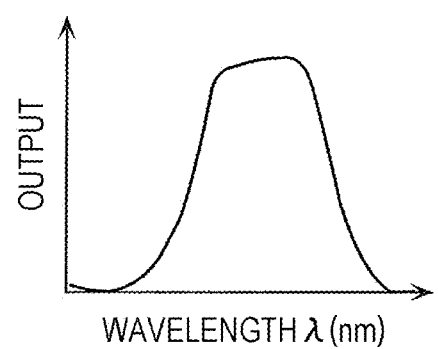
Figure 6B:
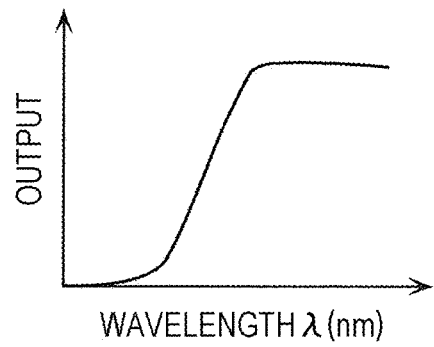

FIG. 6B is a graph illustrating a frequency characteristic of a low-pass filter having high transmittance for only light having a wavelength in a long wavelength region, that is, a low frequency. In the low-pass filter, the nickel oxide (NiOx) is used as the electrochromic substance. As explained above, the nickel oxide (NiOx) is colored in brown when being oxidized. Therefore, the low-pass filter increases transmittance only for light having a wavelength in a long wavelength region such as infrared and near infrared regions including a wavelength of brown.

FIG. 6C is a graph illustrating a frequency characteristic of a band-pass filter having high transmittance for only light having a wavelength in an intermediate wavelength region. In the band-pass filter, the electrochromic substances having the low-pass characteristic and the high-pass characteristic are combined, whereby the transmittances of lights having wavelengths in the short wavelength region and the long wavelength region are reduced and the transmittance of light having a wavelength in the intermediate wavelength region such as a visible light region is improved. Consequently, the band-pass filter absorbs lights having wavelengths in an infrared region and an ultraviolet region and increases transmittance only for light having a wavelength in the visible light region.

Figure 6D:
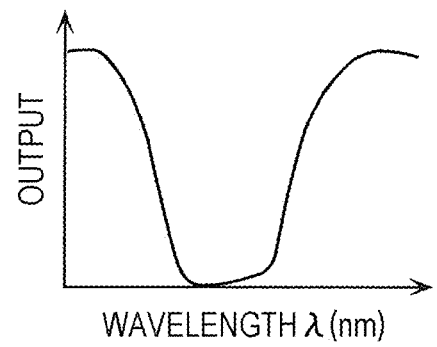

FIG. 6D is a graph illustrating a frequency characteristic of a band elimination filter having high transmittance only for lights having wavelengths in the short wavelength region and the long wavelength region contrary to the band-pass filter. The band elimination filter improves the transmittances of lights in the short wavelength region and the long wavelength region and reduces the transmittance of light in the intermediate wavelength region such as the visible light region. Consequently, it is possible to use the band elimination filter to transmit only lights having wavelengths in the infrared region and the ultraviolet region.

In this way, by using the frequency filter as the electronic ND filter, it is possible to change a wavelength distribution (a color temperature) of light made incident on the light receiving unit 11A more quickly and easily than attaching and detaching a color conversion filter to and from a lens.

Modification 1 of the First Embodiment

Figure 7:
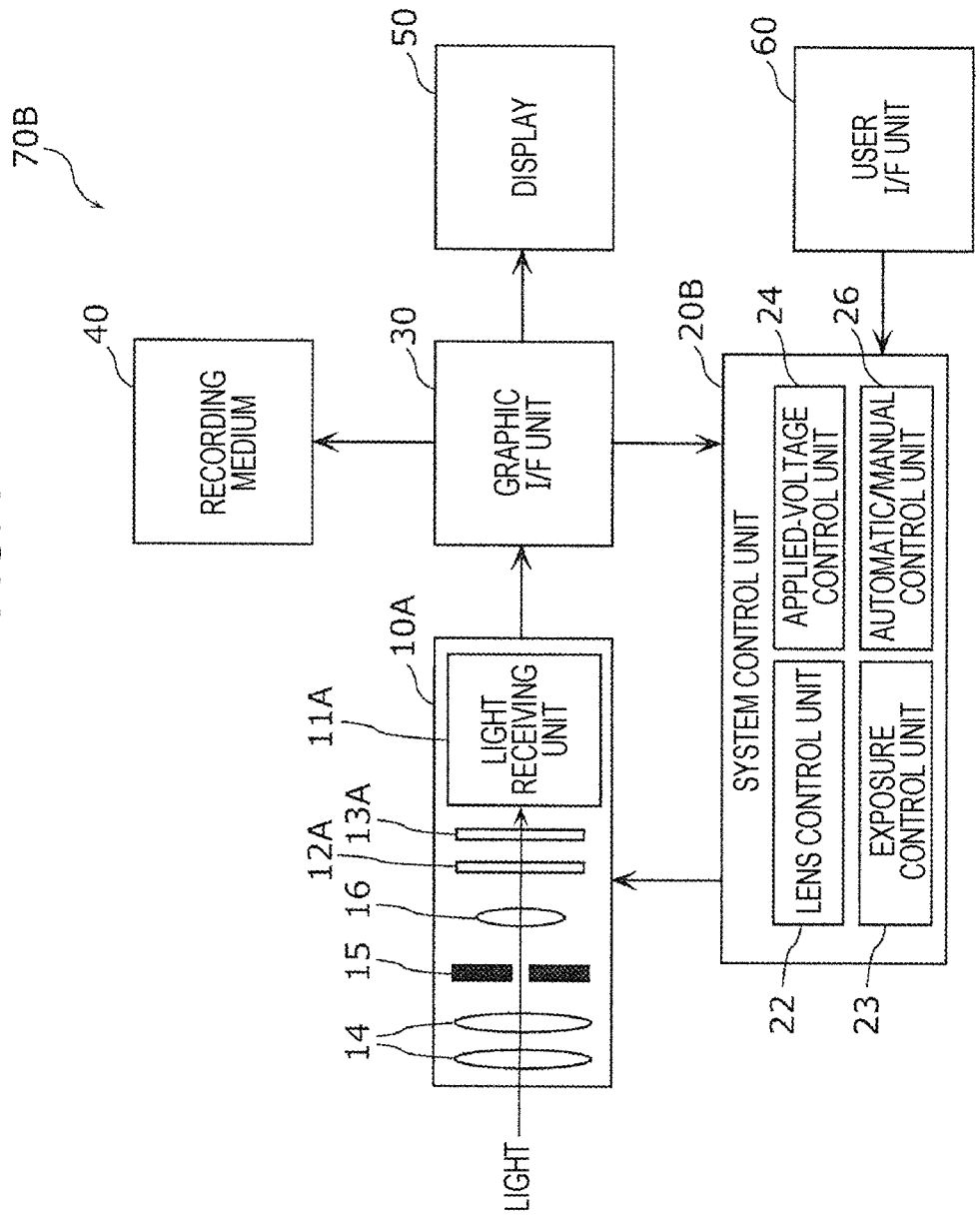
FIG. 7 is a functional block diagram illustrating the configuration of a camera system according to a modification 1 of the first embodiment.

Subsequently, a camera system according to a modification 1 of the first embodiment is explained. FIG. 7 is a functional block diagram illustrating the configuration of a camera system 70B according to this modification. Only differences from the camera system 70A according to the first embodiment are explained below.

The camera system 70B according to this modification may further include an automatic/manual control unit 26 that switches an automatic mode for changing, according to intensity of incident light, a voltage applied by the applied-voltage control unit 24 and a manual mode for changing, according to an instruction from the user, the voltage applied by the applied-voltage control unit 24.

As illustrated in FIG. 7, the camera system 70B according to this modification is different from the camera system 70A according to the first embodiment in that the camera system 70B includes the automatic/manual control unit 26 in a system control unit 20B.

The automatic/manual control unit 26 is a circuit that is connected to the first electronic ND filter 12A and the second electronic ND filter 13A and informs one of automatic control and manual control selected by the user I/F unit 60 to the first electronic ND filter 12A and the second electronic ND filter 13A.

The automatic/manual control unit 26 receives a feature value of imaging data calculated by the graphic I/F unit 30, determines an appropriate imaging condition from the feature value, and performs automatic control for transmitting a control signal to the imaging unit 10A under the determining imaging condition. Further, the automatic/manual control unit 26 also performs manual control in which the user confirms imaging data output from the graphic I/F unit 30 to the display 50 and the automatic/manual control unit 26 transmits a control signal to the imaging unit 10A based on an imaging condition input to the user I/F unit 60 by the user.

For example, when the user selects the automatic control of the electronic ND filter, the automatic/manual control unit 26 selects a voltage having a voltage value corresponding to a recommended ND value, or a pulse voltage having a voltage value and a duty cycle corresponding to the recommended ND value. The selected voltage or pulse voltage is supplied to each of the first electronic ND filter 12A and the second electronic ND filter 13A. When the user selects the automatic control of the electronic ND filter, the user selects an ND value with the user I/F unit 60. A voltage having a voltage value corresponding to the selected ND value or a pulse voltage having a voltage value and a duty cycle corresponding to the selected ND value is supplied to each of the first electronic ND filter 12A and the second electronic ND filter 13A.

FIG. 8 is a table illustrating control patterns of the first electronic ND filter 12A and the second electronic ND filter 13A in the camera system 70B according to this modification.

The user can select control patterns in which both of the first electronic ND filter 12A and the second electronic ND filter 13A are always fixed to the automatic control or the manual control like a pattern 1, a pattern 3, a pattern 7, and a pattern 9 illustrated in FIG. 8. Alternatively, as in the pattern 5 illustrated in FIG. 8, the user can select a control pattern in which both of the first electronic ND filter 12A and the second electronic ND filter 13A can always be switched to the automatic control or the manual control. The user can select a control pattern in which one of the first electronic ND filter 12A and the second electronic ND filter 13A can be switched to the automatic control or the manual control and the other of the first electronic ND filter 12A and the second electronic ND filter 13A is always fixed to the manual control or the automatic control.

Second Embodiment

Figure 9:
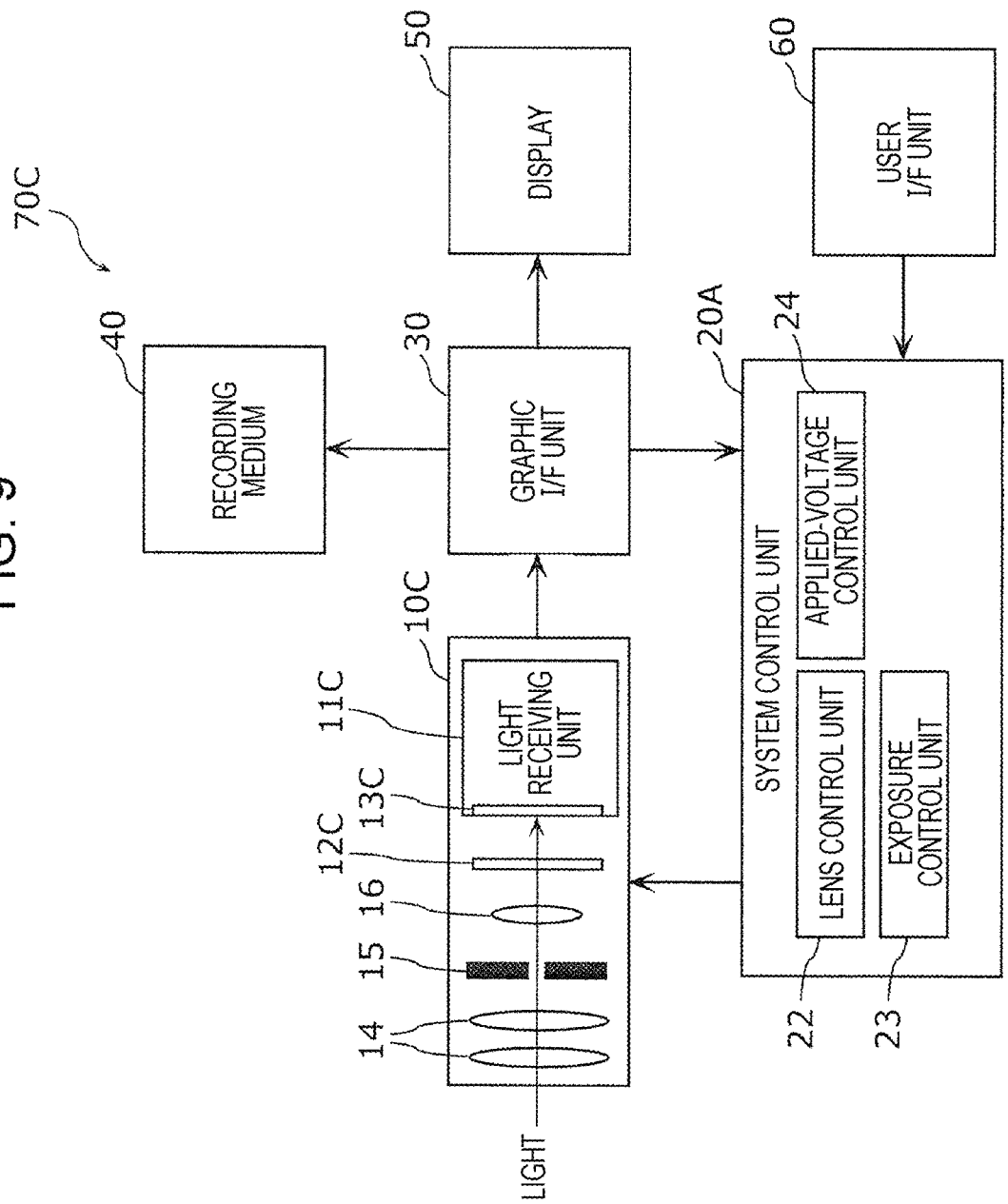
FIG. 9 is a functional block diagram illustrating the configuration of a camera system according to a second embodiment.

An overview of a camera system according to a second embodiment is explained below. FIG. 9 is a functional block diagram illustrating the configuration of a camera system 70C according to this embodiment. Note that, in FIG. 9, only components different from the components of the camera system 70A according to the first embodiment are denoted by different reference numerals and signs.

In the camera system 70C according to this embodiment, a first conversion unit 12C may be a filter that changes a gain by attenuating a light amount of incident light according to an applied voltage. A light receiving unit 110 includes a photoelectric conversion unit. The photoelectric conversion unit may include a photoelectric conversion layer that converts light passed through the first conversion unit 12C into an electric signal and two electrodes sandwiching the photoelectric conversion layer. The photoelectric conversion unit may function as a second conversion unit 13C and change a gain by changing, according to the applied voltage, quantum efficiency in converting the incident light into the electric signal.

Only components different from the components of the camera system 70A according to the first embodiment are explained below.

As illustrated in FIG. 9, the camera system 70C according to this embodiment is different from the camera system 70A in the first embodiment in that the photoelectric conversion unit in the light receiving unit 110 functions as a second conversion unit 13C. At this time, the first conversion unit 12C is disposed separately from the light receiving unit 110.

Figure 10:
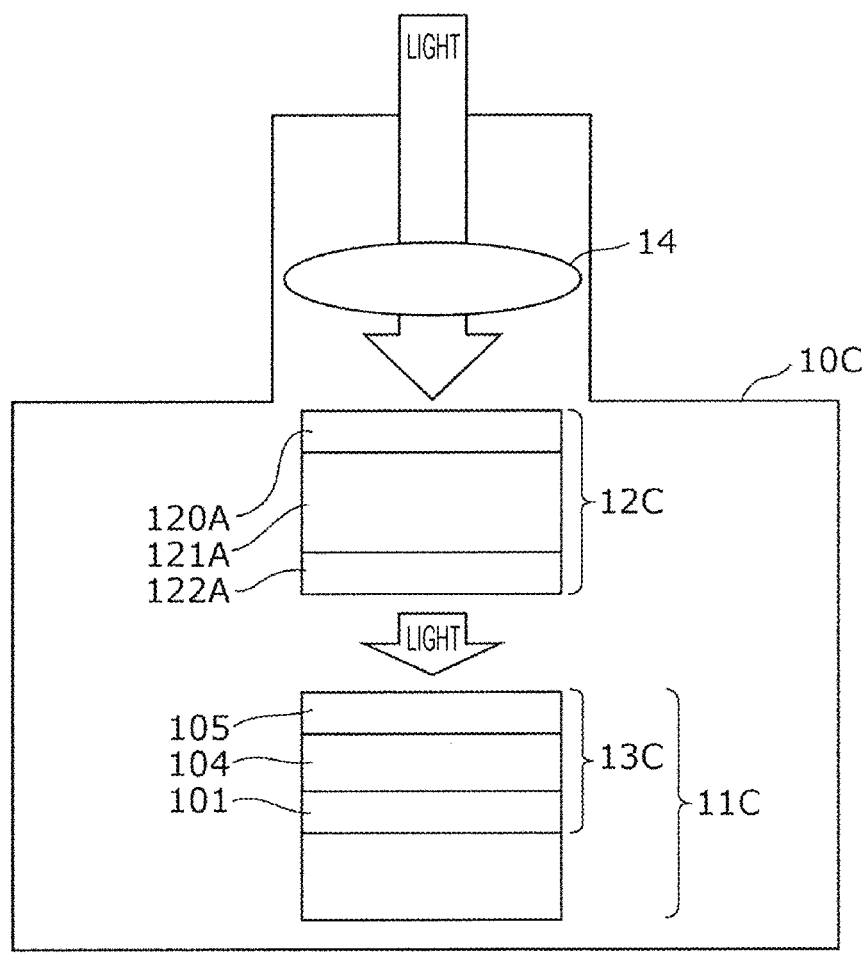
FIG. 10 is a diagram for explaining the configuration of a first conversion unit and a second conversion unit in the camera system according to the second embodiment.

Subsequently, an ND mechanism in the camera system 70C according to this embodiment is explained in detail with reference to FIG. 10. FIG. 10 is a diagram for explaining the configuration of the first conversion unit 12C and the second conversion unit 13C in the camera system 70C according to this embodiment. Note that, in FIG. 10, only components necessary for explaining the ND mechanism are described. In this embodiment, the first conversion unit 12C is an electronic ND filter. In the following explanation, in this embodiment, the first conversion unit 12C is referred to as first electronic ND filter 12C. Note that, in this embodiment, an example is explained in which the first electronic ND filter 12C is provided separately from the light receiving unit 110. However, two or more electronic ND filters may be provided separately from the light receiving unit 110. The electronic ND filters may be filters including different ND mechanisms.

As illustrated in FIG. 10, incident light is made incident on an imaging unit 100 through the lens 14. The light made incident on the imaging unit 100 passes through the first electronic ND filter 12C and is thereafter made incident on the second conversion unit 13C in the light receiving unit 110. The first electronic ND filter 12C is, for example, a liquid crystal-type electronic ND filter. The second conversion unit 13C is a photoelectric conversion unit in the light receiving unit 110. The first electronic ND filter 12C includes the pair of electrodes 120A and 122A and the first ND filter layer 121A sandwiched by the pair of electrodes 120A and 122A. The photoelectric conversion unit includes a pair of electrodes 105 and 101 and a photoelectric conversion layer 104 sandwiched between the pair of electrodes 105 and 101. The photoelectric conversion unit converts light made incident on the photoelectric conversion unit into an electric signal.

The graphic I/F unit 30 transmits, to the system control unit 20A, a feature value calculated from imaging data, which have been output from the light receiving unit 110 and digitally processed. The applied-voltage control unit 24 transmits, to the imaging unit 100, an instruction for adjusting an applied voltage to the photoelectric conversion unit, which is the first electronic ND filter 12C and the second conversion unit 13C, based on the feature value received by the system control unit 20A.

In this embodiment, the applied-voltage control unit 24 adjusts an attenuation ratio of light by controlling an applied voltage of the first electronic ND filter 12C and adjusts light sensitivity of the photoelectric conversion unit by controlling an applied voltage to the photoelectric conversion unit, which is the second conversion unit 13C. Note that an adjusting method for the light sensitivity of the photoelectric conversion unit is explained below with reference to FIG. 12.

The camera system 70C according to this embodiment has such a configuration. Therefore, sensitivity can be more finely and more quickly adjusted with respect to a change in brightness.

The photoelectric conversion unit is explained. The photoelectric conversion unit includes a counter electrode 105, a pixel electrode 101 and a photoelectric conversion layer 104 sandwiched between the counter electrode 105 and the pixel electrode 101.

Figure 11:
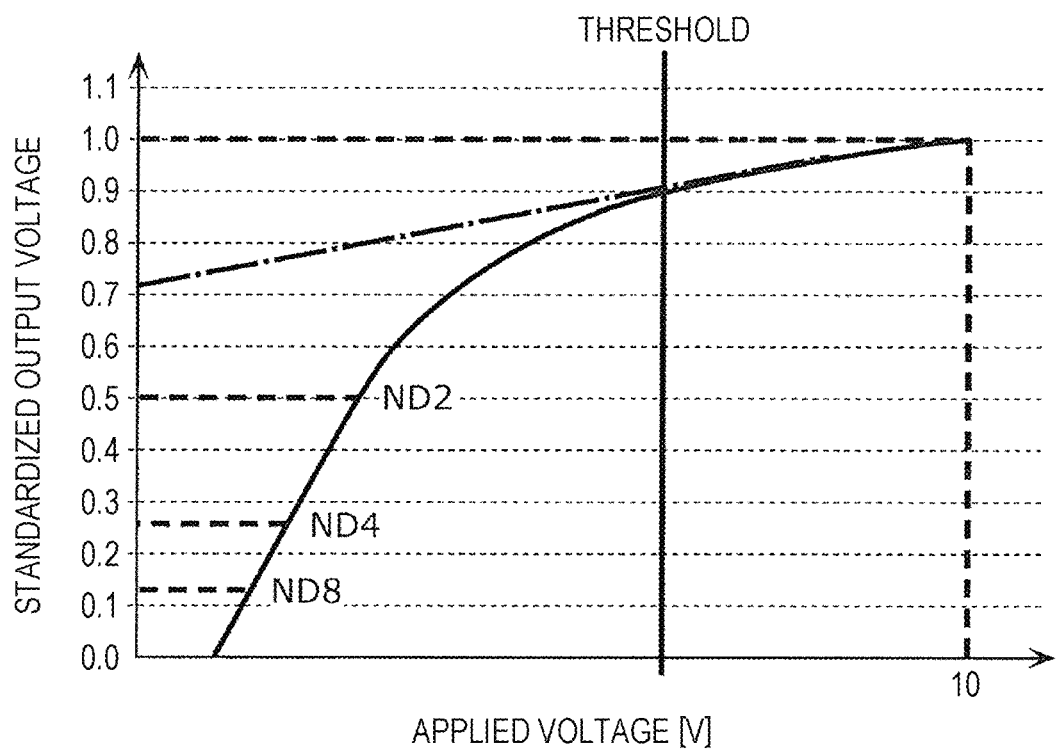
FIG. 11 is a graph illustrating a relation between an applied voltage to a photoelectric conversion unit and an output voltage from a light receiving unit.

The counter electrode 105 is typically a transparent electrode formed of a transparent conductive material. The counter electrode 105 is disposed on a side on which light is made incident in the photoelectric conversion unit. Therefore, light passed through the counter electrode 105 is made incident on the photoelectric conversion layer 104. Note that the light detected by the imaging unit 100 is not limited to light in a wavelength region of visible light (e.g., 380 nm or more and 780 nm or less). "Transparent" in this specification means that at least a part of light in a wavelength region to be detected is transmitted. It is not essential to transmit light over the entire wavelength region of the visible light. In this specification, an entire electromagnetic wave including an infrared ray and an ultraviolet ray is represented as "light" for convenience. As the counter electrode 105, a transparent conducting oxide (TCO) such as indium tin oxide (ITO), indium zinc oxide (IZO), aluminum-doped zinc oxide (AZO), fluorine-doped tin oxide (FTO), $SnO_2$, $TiO_2$, or $ZnO_2$ can be used. FIG. 11 illustrates a relation between an applied voltage to a photoelectric conversion unit with ITO and an output voltage of the light receiving unit 110.

The photoelectric conversion layer 104 receives incident light and generates a hole-electron pair. An electric charge of one of the generated hole-electron pair is captured by the pixel electrode 101 as a signal charge. The electric charge captured by the pixel electrode 101 is detected by a known signal detection circuit. The signal detection circuit may include an amplification transistor that amplifies a signal corresponding to the signal charge and outputs the signal. A gate of the amplification transistor may be electrically connected to the pixel electrode 101. The photoelectric conversion layer 104 is typically formed of an organic semiconductor material such as quinacridone.

Subsequently, an overview of a method of causing the photoelectric conversion unit as an electronic ND filter is explained.

FIG. 11 is a graph illustrating a relation between an applied voltage to the photoelectric conversion unit and an output voltage from the light receiving unit 110. The vertical axis of FIG. 11 indicates a normalized output voltage. The normalized output voltage is a normalized value. The output voltage from the light receiving unit 110 when the applied voltage to the photoelectric conversion unit is 10 V is set to 1.0 as a reference of the normalization. Note that the output voltage at the time when the applied voltage is 10 V does not need to be set as a reference of the normalization. The reference of the normalization may be changed as appropriate. Further, a range where linearity is secured can be different from the range illustrated in this figure since a threshold can also be changed according to a calculation method and a calculation range for an approximation straight line.

It is seen from FIG. 11 that the output voltage from the light receiving unit 110 can be adjusted by adjusting the applied voltage to the photoelectric conversion unit. For example, in the graph illustrated in FIG. 11, a normalized output voltage equivalent to ND2, which represents a filter that reduces an amount of incident light by half, is 0.5, which is a half of 1.0. Therefore, it is seen that, by applying a voltage for adjusting the normalized output voltage to 0.5 to the photoelectric conversion unit, an ND function equivalent to the ND2 can be realized by the photoelectric conversion unit. A normalized output voltage equivalent to ND4, which represents a filter that reduces an amount of incident light to ¼, is 0.25, which is a quarter of 1.0. A normalized output voltage equivalent to NDB, which represents a filter that reduces an amount of incident light to ⅛, is 0.125, which is one eighth of 1.0. Concerning these NDs, ND functions can be realized by the photoelectric conversion unit, by applying a voltage corresponding to each normalized output voltage to the photoelectric conversion unit.

Therefore, by applying a voltage corresponding to a normalized output voltage equivalent to a desired ND function to the photoelectric conversion unit, the photoelectric conversion unit can function as an electronic ND filter. However, linearity may not be always secured over an entire range of the applied voltage to the photoelectric conversion unit.

For example, as illustrated in FIG. 11, a range where linearity is secured between the applied voltage to the photoelectric conversion unit and the output voltage (here, normalized output voltage) from the light receiving unit 11C, and a range where linearity is not secured are present. In a range where the applied voltage is larger than a threshold, that is, in a voltage range where linearity is secured between the applied voltage and the normalized output voltage, a linear correlation is obtained between the applied voltage and the normalized output voltage. Therefore, the light sensitivity of the photoelectric conversion unit can be easily adjusted by adjusting the magnitude of the applied voltage to the photoelectric conversion unit. On the other hand, in a range where the applied voltage is smaller than the threshold, that is, a voltage range where linearity is not secured between the applied voltage and the normalized output voltage, an applied voltage corresponding to a desired normalized output voltage is calculated from a function representing a relation between the applied voltage to the photoelectric conversion unit and the normalized output voltage. Therefore, it is necessary to cause the camera system to store the function representing the relation between the applied voltage and the normalized output voltage.

Therefore, when the light sensitivity of the photoelectric conversion unit is adjusted to perform a desired ND function, an applied voltage in a range where linearity is secured between the applied voltage and the normalized output voltage may be used. This will make it easy to control the light sensitivity of the photoelectric conversion unit. Consequently, it is unnecessary to cause the camera system to store the function. The light sensitivity of the photoelectric conversion unit can be simply adjusted and the ND function can be realized by the photoelectric conversion unit.

Figure 12:
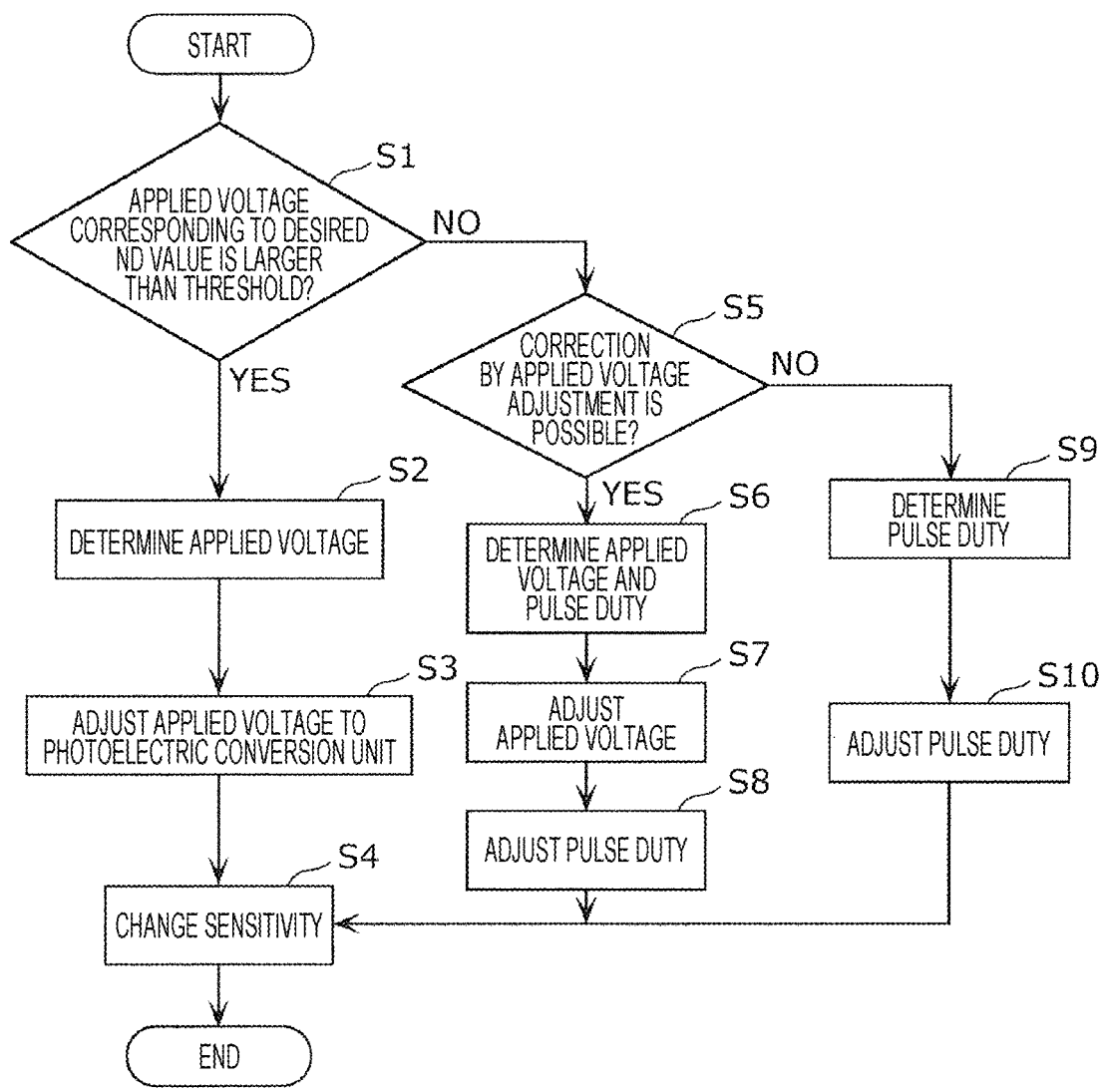
FIG. 12 is a flowchart for explaining a procedure for correcting light sensitivity of a photoelectric conversion unit when the photoelectric conversion unit is used as an electronic ND filter.

Subsequently, a procedure for controlling the light sensitivity of the photoelectric conversion unit used as an electronic ND filter is explained. FIG. 12 is a flowchart for explaining a procedure for correcting the light sensitivity of the photoelectric conversion unit when the photoelectric conversion unit is used as an electronic ND filter.

In the camera system 70C according to this embodiment, the applied-voltage control unit 24 may change, according to quantum efficiency, a duty cycle of a pulse voltage applied to the photoelectric conversion unit. In this embodiment, the photoelectric conversion unit is the second conversion unit 13C.

As illustrated in FIG. 12, first, the applied-voltage control unit 24 obtains an output voltage of the light receiving unit 11C corresponding to the desired ND value, and determines whether an applied voltage corresponding to the output voltage is larger than the threshold (see FIG. 11) (step S1). When the applied voltage is larger than the threshold (YES in step S1), a linear correlation is obtained between the applied voltage to the photoelectric conversion unit and the output voltage. Therefore, the applied-voltage control unit 24 determines an applied voltage corresponding to the desired ND value (step S2) and adjusts a voltage value of the voltage applied to the photoelectric conversion unit (step S3). Consequently, the photoelectric conversion unit can be changed to light sensitivity corresponding to the desired ND value (step S4).

Subsequently, an adjusting method for the light sensitivity of the photoelectric conversion unit in a voltage range where linearity is not secured between the applied voltage and the normalized output voltage (NO in step S1) is explained.

First, the applied-voltage control unit 24 obtains an output voltage of the light receiving unit 11C corresponding to the desired ND value, and determines whether an applied voltage corresponding to the output voltage is larger than the threshold (see FIG. 11), for example, 9 V (step S1). When the applied-voltage control unit 24 determines that the applied voltage is equal to or smaller than the threshold 9 V (NO in step S1), the applied-voltage control unit 24 determines whether correction of the ND value by adjustment of the applied voltage is possible (step S5). In step S5, the applied-voltage control unit 24 determines whether the correction of the ND value by the adjustment of the applied voltage is possible, based on whether the applied voltage is larger than a second threshold. The second threshold in step S5 is 7V, for example.

In a range where the applied voltage is equal to or smaller than the threshold 9 V and in the vicinity of 9V in step S1, linearity is sometimes obtained depending on a calculation method for an approximation straight line. Accordingly, the light sensitivity of the photoelectric conversion unit can also be controlled in the range, by determining an applied voltage corresponding to the desired ND value and applying the determined voltage to the photoelectric conversion unit. For example, in a range larger than 7 V and equal to or smaller than 9 V in FIG. 11, linearity may be obtained depending on a calculation method for an approximation straight line, though linearity is not obtained in this range. In such a range, a pulse voltage having a certain voltage value and a certain duty cycle may be used to adjust a light sensitivity corresponding to the desired ND value. The pulse voltage will be described later.

Therefore, when determining that the correction of the ND value by the adjustment of the applied voltage is possible (YES in step S5), the applied-voltage control unit 24 determines a combination of a voltage value and a duty cycle (step S6). Subsequently, the applied-voltage control unit 24 adjusts the voltage value determined in step S6 (step S7) and adjusts the duty cycle determined in step S6 (step S8). Consequently, the photoelectric conversion unit can be changed to have a light sensitivity corresponding to the desired ND value (step S4).

On the other hand, when it is determined that the correction of the ND value by the adjustment of the applied voltage is not possible (NO in step S5), that is, the applied voltage corresponding to the desired ND value is 7 V or smaller, linearity is not obtained between the applied voltage and the normalized output voltage. Further, in this case, when the applied voltage corresponding to the desired ND value is directly applied to the photoelectric conversion unit, a white balance is deteriorated as explained below with reference to FIG. 24. Therefore, the applied-voltage control unit 24 determines a duty cycle that can realize the desired ND value (step S9), based on a relation between an applied voltage and the normalized output voltage in a range where the applied voltage is larger than the threshold 9 V in step S1, that is, in a range where linearity is secured. The applied-voltage control unit 24 sets a voltage value of the applied voltage to a predetermined value and adjusts a duty cycle of the applied voltage to the determined duty cycle (step S10). The predetermined value may be a value larger than the threshold 9 V. Consequently, the photoelectric conversion unit can be changed to have a light sensitivity corresponding to the desired ND value (step S4). The deterioration in the white balance can be reduced by setting the voltage value of the applied voltage to a value larger than the threshold 9 V.

Note that, in the explanation in this embodiment, the range of threshold 9 V or smaller is divided into the vicinity region (e.g., larger than 7 V and 9 V or smaller) of the threshold and the range equal to or smaller than the vicinity region (e.g., 7 V or smaller). However, the range of threshold 9 V or smaller does not have to be finely divided as explained above. For example, in a range where the applied voltage corresponding to the desired ND value is larger than the threshold 9 V, the light sensitivity may be adjusted by the adjustment of the applied voltage in steps S1 to S4. In a range where the applied voltage corresponding to the desired ND value is 9 V or smaller, the light sensitivity may be adjusted by the adjustment of the duty cycle in steps S9 to S10. When the light sensitivity is adjusted by the adjustment of the duty cycle, the voltage value of the applied voltage may be adjusted, or the voltage value of the applied voltage may be fixed to a predetermined value.

As explained above, in FIG. 12, an example is explained in which the threshold is provided between the range where linearity is secured between the applied voltage to the photoelectric conversion unit and the normalized output voltage and the range where linearity is not secured. However, irrespective of the threshold, a correlation is obtained between a voltage control scheme for controlling the voltage value of the applied voltage and a pulse duty control scheme for converting the applied voltage into pulse voltage. The correlation between these control schemes is explained below.

Figure 13:
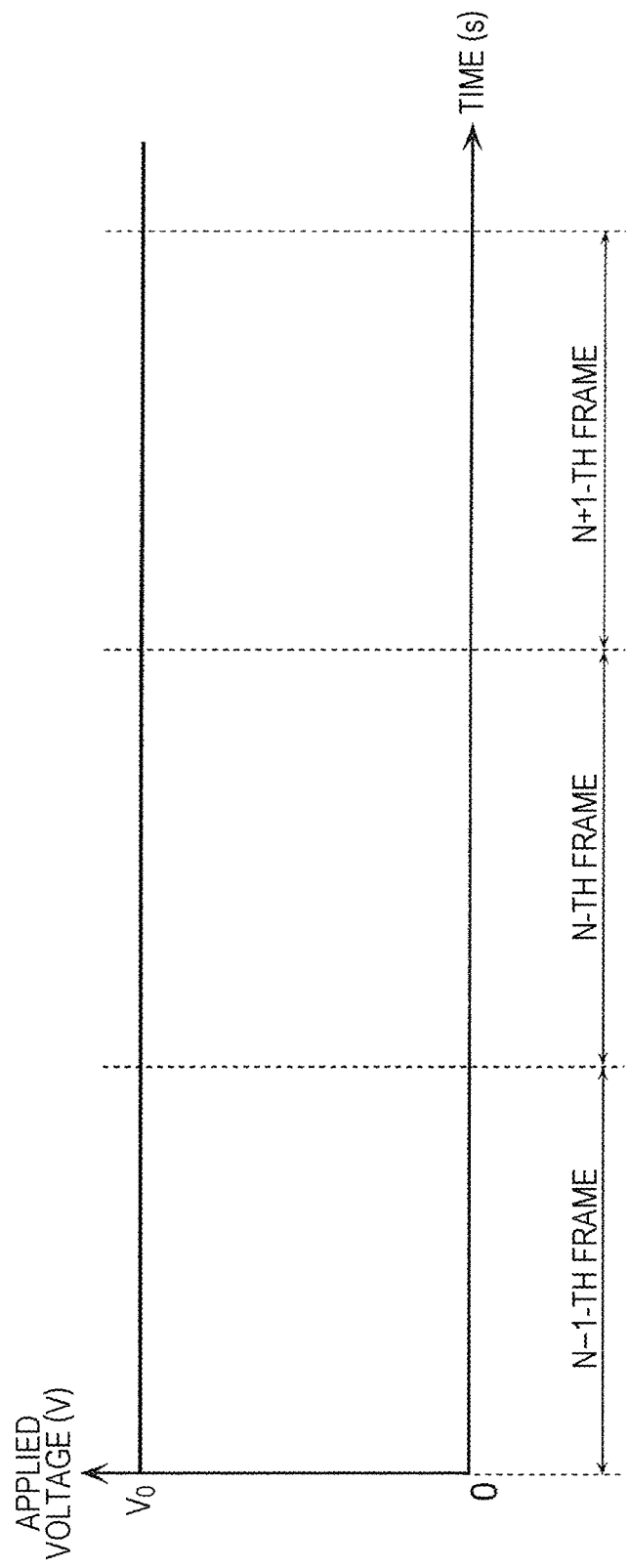
FIG. 13 is an example of a timing chart for adjusting the light sensitivity according to a voltage control scheme.
Figure 14:
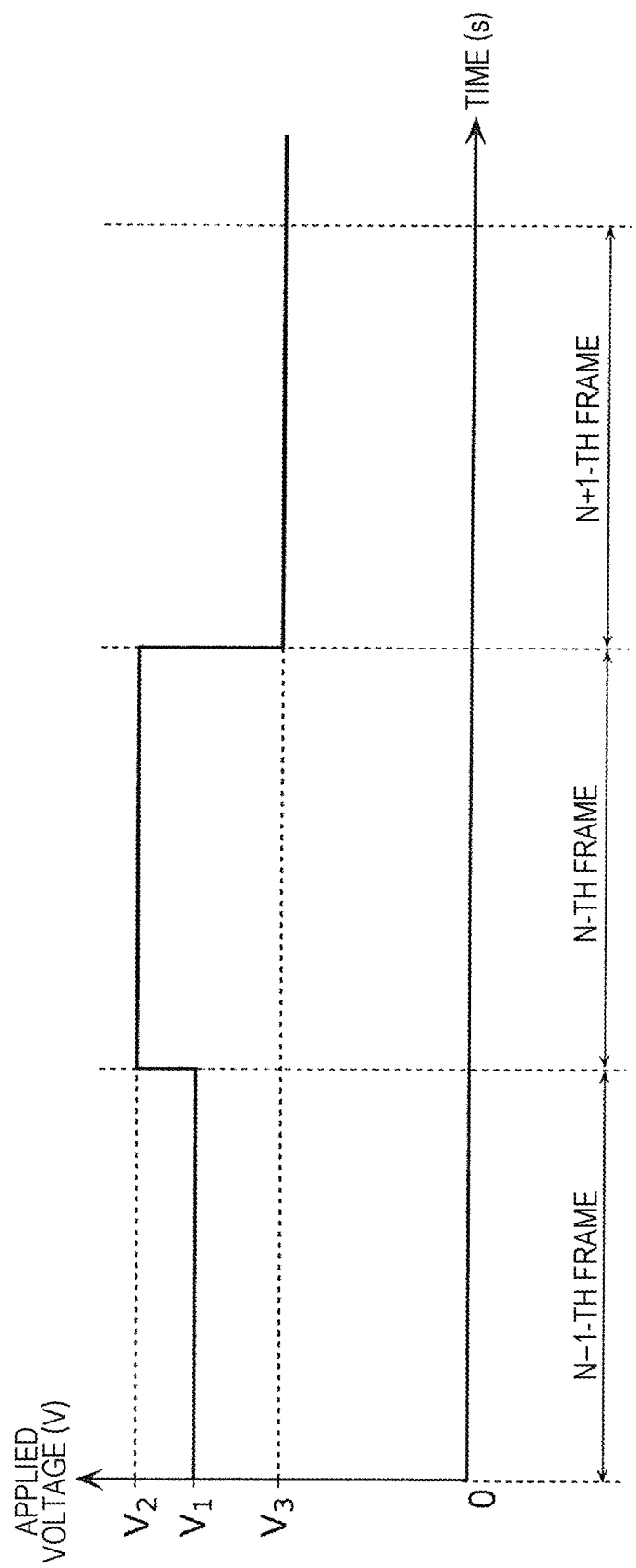
FIG. 14 is another example of the timing chart for adjusting the light sensitivity according to the voltage control scheme.

FIG. 13 is an example of a timing chart for adjusting light sensitivity according to the voltage control scheme. FIG. 14 is another example of the timing chart for adjusting light sensitivity according to the voltage control scheme.

In FIGS. 13 and 14, the vertical axis indicates an applied voltage to the photoelectric conversion unit and the horizontal axis indicates an application time. Changes in applied voltages in any three frames, that is, an N−1-th frame, an N-th frame, and an N+1-th frame are illustrated. Note that the same applies in FIGS. 15 and 16 referred to below.

When a light amount of incident light on an imaging unit 10D from an object is stable, as illustrated in FIG. 13, the applied voltages to the photoelectric conversion unit in the N−1-th frame, the N-th frame, and the N+1-th frame are constant. In this way, when the light amount of the incident light is stable, it is unnecessary to adjust an ND value for each frame. A stable moving image can be acquired even if the applied voltage has a fixed value ($V_0$).

When the light amount of the incident light on the imaging unit 10D from the object fluctuates, that is, when brightness of the object repeats an increase and a decrease, as illustrated in FIG. 14, the applied voltages are adjusted in the respective frames of the N−1-th frame, the N-th frame, and the N+1-th frame. When the light amount of the incident light fluctuates in this way, the applied voltages are adjusted for each frame to, for example, an applied voltage $V_1$ in the N−1-th frame, an applied voltage $V_2$ ($>V_1$) in the N-th frame, and an applied voltage $V_3$ ($<V_2$) in the N+1-th frame. This changes the output voltage to be equivalent to the desired ND value. Consequently, the light sensitivity of the photoelectric conversion unit can be appropriately adjusted according to a change in the light amount of the incident light. Therefore, a moving image having a stable light amount can be acquired. Note that, in FIG. 14, it is assumed that $V_1$, $V_2$, and $V_3$ [V] are applied voltages equal to or higher than the threshold voltage illustrated in FIG. 11.

Figure 15:
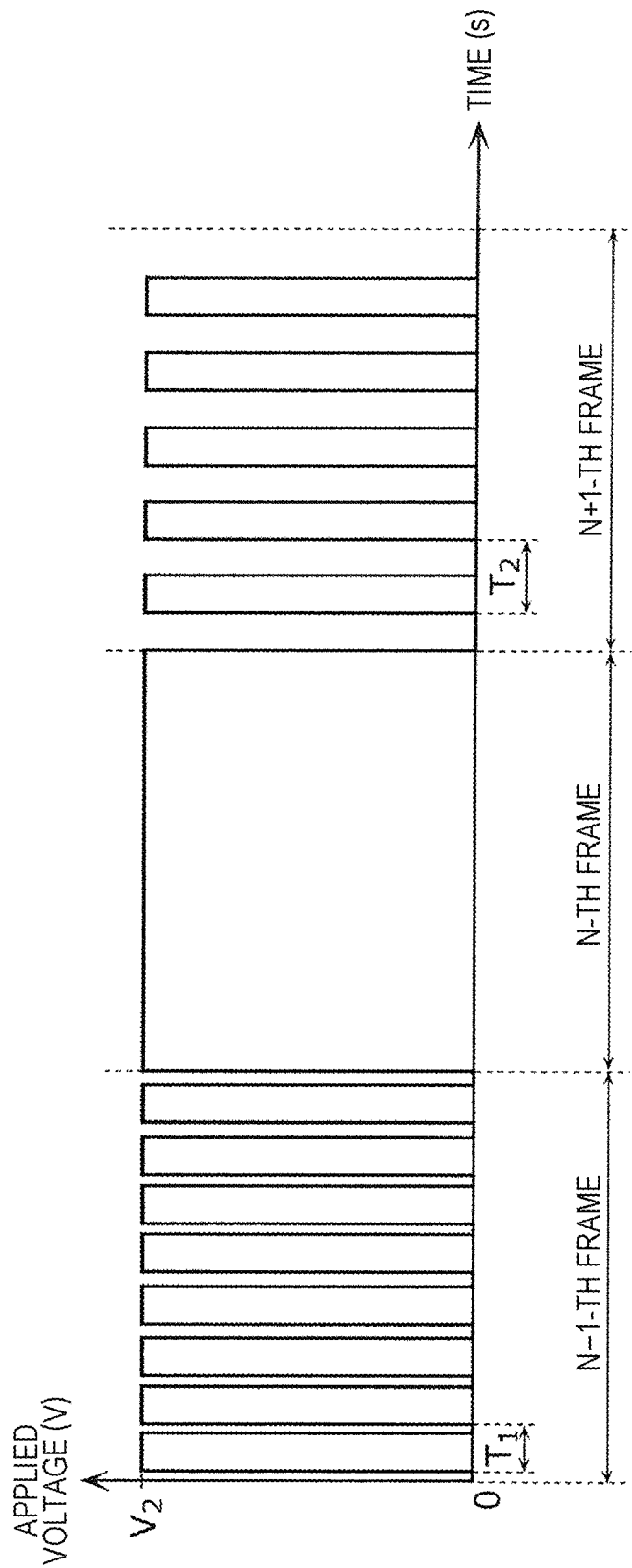
FIG. 15 is an example of a timing chart for adjusting the light sensitivity according to a pulse duty control scheme.

Subsequently, an example is explained in which the light sensitivity of the photoelectric conversion unit is adjusted according to the pulse duty control scheme. FIG. 15 is an example of the timing chart for adjusting the light sensitivity according to the pulse duty control scheme.

In the timing chart illustrated in FIG. 14, when $V_1$ and $V_3$ are smaller than the threshold voltage illustrated in FIG. 11, a method of adjusting the light sensitivity according to the pulse duty control scheme is also effective. In the following explanation, it is assumed that $V_1$ and $V_3$ are smaller than the threshold voltage illustrated in FIG. 11.

In the timing chart illustrated in FIG. 15, a voltage value of an applied voltage is fixed at $V_2$ and a duty cycle of the applied voltage is changed for each frame. At this time, applied voltages in the frames illustrated in FIG. 15 respectively have correlations with the applied voltages in the frames illustrated in FIG. 14. Specifically, for example, in a pulse period $T_1$ [s] of the applied voltage in the N−1-th frame, a length of a High period is set based on $V_1/V_2$ and a length of a Low period is set based on $(V_2-V_1)/V_2$. That is, the duty cycle in the N−1-th frame is set to $V_1/V_2$. Consequently, an applied voltage equivalent to the applied voltage $V_1$ in the N−1-th frame in FIG. 14 can be reproduced. Similarly, in a pulse period $T_2$ [s] of the applied voltage in the N+1-th frame illustrated in FIG. 15, a length of a High period is set based on $V_3/V_2$ and a length of a Low period is set based on $(V_2-V_3)/V_2$. That is, the duty cycle in the N+1-th frame is set to $V_3/V_2$. Consequently, an applied voltage equivalent to the applied voltage $V_3$ in the N+1-th frame illustrated in FIG. 14 can be reproduced. Quantum efficiency of the photoelectric conversion unit at the time when the light sensitivity of the photoelectric conversion unit, that is, the ND value is adjusted only with a voltage value of the applied voltage illustrated in FIG. 14 is the same as quantum efficiency of the photoelectric conversion unit at the time when the ND value is adjusted with only the duty cycle illustrated in FIG. 15.

Figure 16:
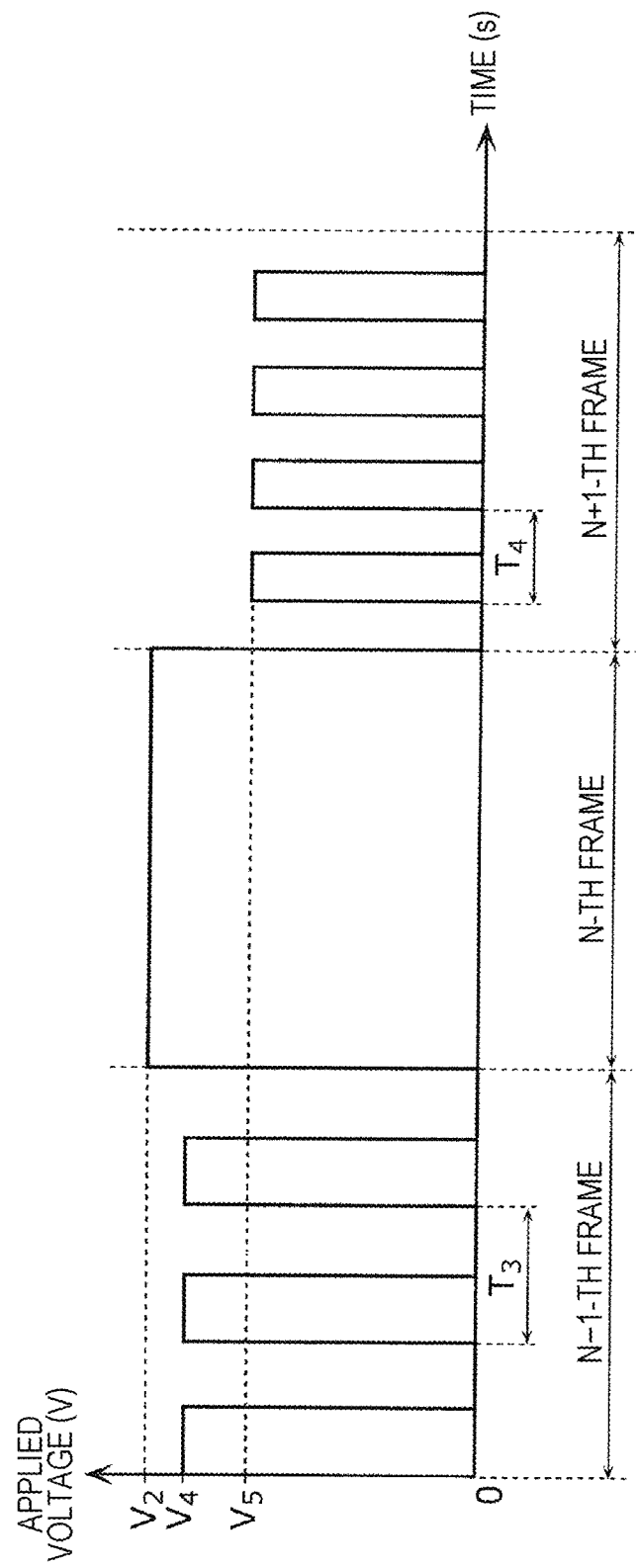
FIG. 16 is another example of the timing chart for adjusting the light sensitivity according to the pulse duty control scheme.

FIG. 16 is another example of the timing chart for adjusting light sensitivity according to the pulse duty control scheme. In the timing chart illustrated in FIG. 16, both of a voltage value and a duty cycle of an applied voltage value are changed for each frame. At this time, applied voltages in frames illustrated in FIG. 16 respectively have correlations with the applied voltages in the frames illustrated in FIG. 14. Specifically, a voltage value of an applied voltage in the N−1-th frame in FIG. 16 is set to $V_4$ ($<V_2$) [V] and, in a pulse period $T_3$ [s], a length of a High period is set based on $V_1/V_4$ and a length of a Low period is set based on $(V_4-V_1)/V_4$. That is, the duty cycle in the N−1-th frame is set to $V_1/V_4$. Consequently, an applied voltage equivalent to the applied voltage $V_1$ in the N−1-th frame in FIG. 14 can be reproduced. Similarly, a voltage value of an applied voltage in the N+1-th frame in FIG. 16 is set to $V_5$ ($<V_2$) [V] and, in a pulse period $T_4$ [s], a length of a High period is set based on $V_3/V_5$ and a length of a Low period is set based on $(V_5-V_3)/V_5$. That is, the duty cycle in the N+1-th frame is set to $V_3N_5$. Consequently, an applied voltage equivalent to the applied voltage $V_3$ in the N+1-th frame in FIG. 14 can be reproduced. Quantum efficiency of the photoelectric conversion unit at the time when the ND value is adjusted only with the voltage value of the applied voltage illustrated in FIG. 14 is the same as quantum efficiency of the photoelectric conversion unit at the time when the ND value is adjusted with the voltage value of the applied voltage and the duty cycle illustrated in FIG. 16.

Note that, in FIGS. 15 and 16, it is assumed that $V_2$, $V_4$, and $V_5$ [V] are voltage values of applied voltages, at which linearity is secured, equal to or higher than the threshold voltage illustrated in FIG. 11. FIGS. 13 to 16 are examples in which one frame is 1/60 [s]. However, in the present disclosure, the same effect can be expanded at other frame rates such as 1/120 [s] and 1/180 [s] of one frame.

Note that, in this embodiment, as explained below in a modification 3 of the second embodiment, the system control unit 20A may include a white-balance control unit and a white balance table. Further, the system control unit 20A may include an automatic/manual control unit.

Figure 24:
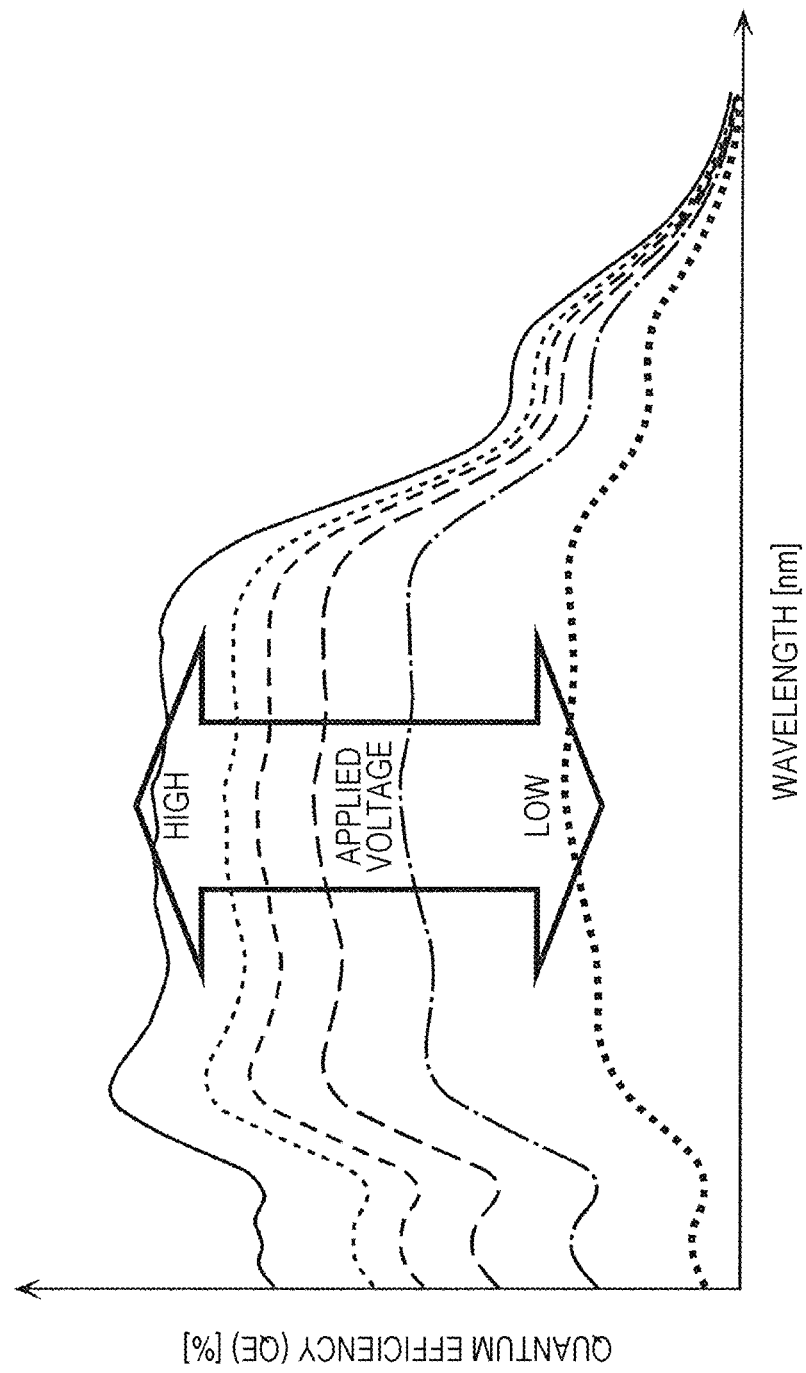
FIG. 24 is a graph illustrating a relation between an applied voltage to a photoelectric conversion unit and a spectral characteristic.

In the examples illustrated in FIGS. 11 and 24, deterioration in linearity between the applied voltage and the normalized output voltage and breakage of white balance occur when the applied voltage is lowered. The same effects as the effects explained above can be obtained in a photoelectric conversion unit in which deterioration in linearity and breakage of white balance occur when the applied voltage is raised. For example, in the photoelectric conversion unit in which linearity is deteriorated when the applied voltage is raised, a constant voltage may be applied for a light sensitivity corresponding to a voltage range with high linearity. A pulse voltage may be applied for a light sensitivity corresponding to a voltage range with low linearity.

Modification 1 of the Second Embodiment

Figure 17:
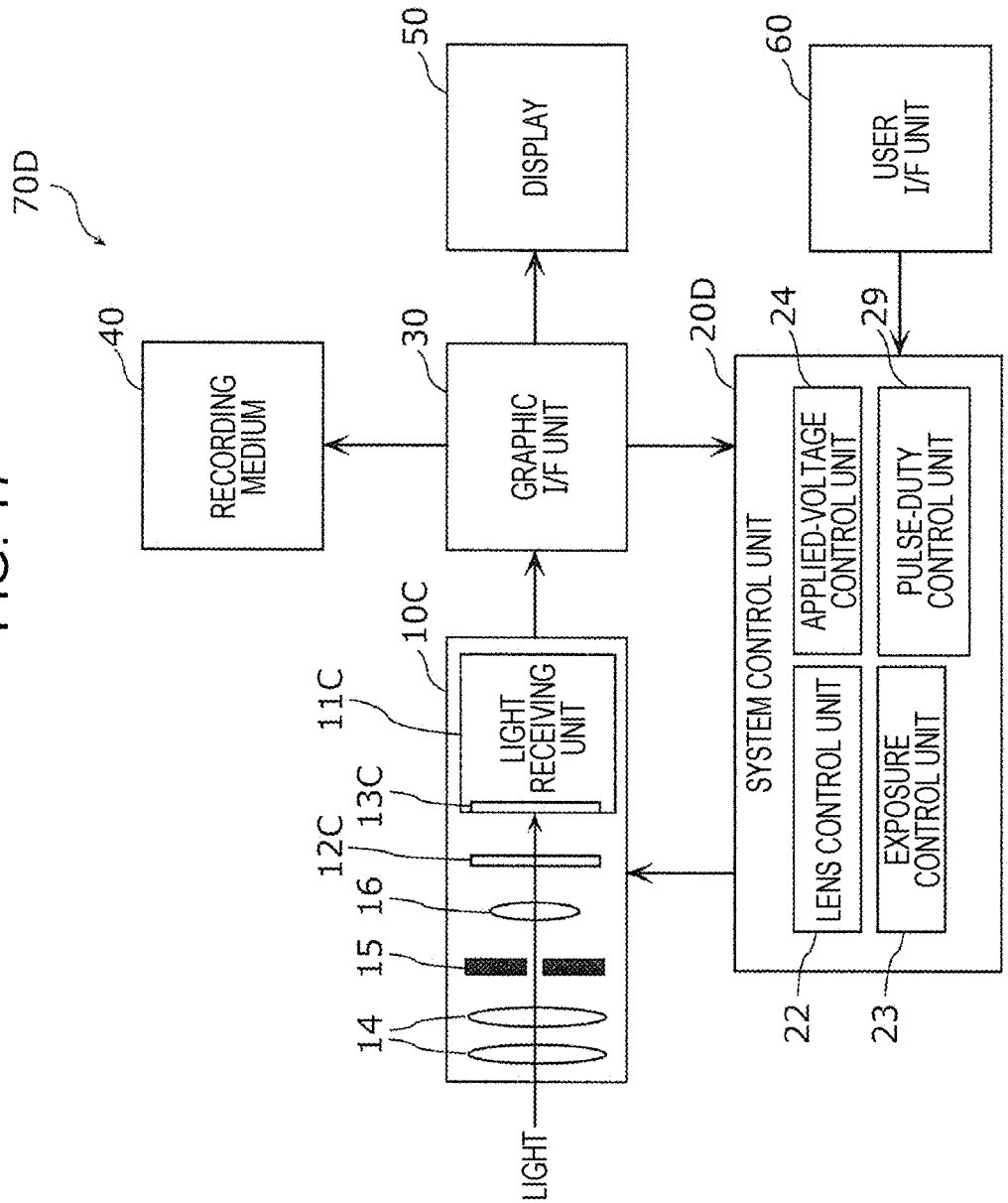
FIG. 17 is a functional block diagram illustrating the configuration of a camera system according to a modification 1 of the second embodiment.

Subsequently, a camera system according to a modification 1 of the second embodiment is explained. FIG. 17 is a functional block diagram illustrating the configuration of a camera system 70D according to this modification. In the following explanation, only differences from the camera system 70C according to the second embodiment are explained.

As illustrated in FIG. 17, the camera system 70D according to this modification is different from the camera system 70C according to the second embodiment in that the camera system 70D includes a pulse-duty control unit 29 in a system control unit 20D.

The pulse-duty control unit 29 controls the light sensitivity of the photoelectric conversion unit based on a feature value of imaging data transmitted from the graphic I/F unit 30. In the second embodiment, the applied-voltage control unit 24 controls the applied voltages to the first electronic ND filter 12C and the photoelectric conversion unit. The first electronic ND filter 12C is disposed separately from the light receiving unit 110, and the photoelectric conversion unit is the second conversion unit 13C. In this modification, the applied-voltage control unit 24 controls an applied voltage to the first electronic ND filter 12C. The pulse-duty control unit 29 controls the applied voltage to the photoelectric conversion unit in the same manner as the control explained above in the second embodiment.

Figure 18:
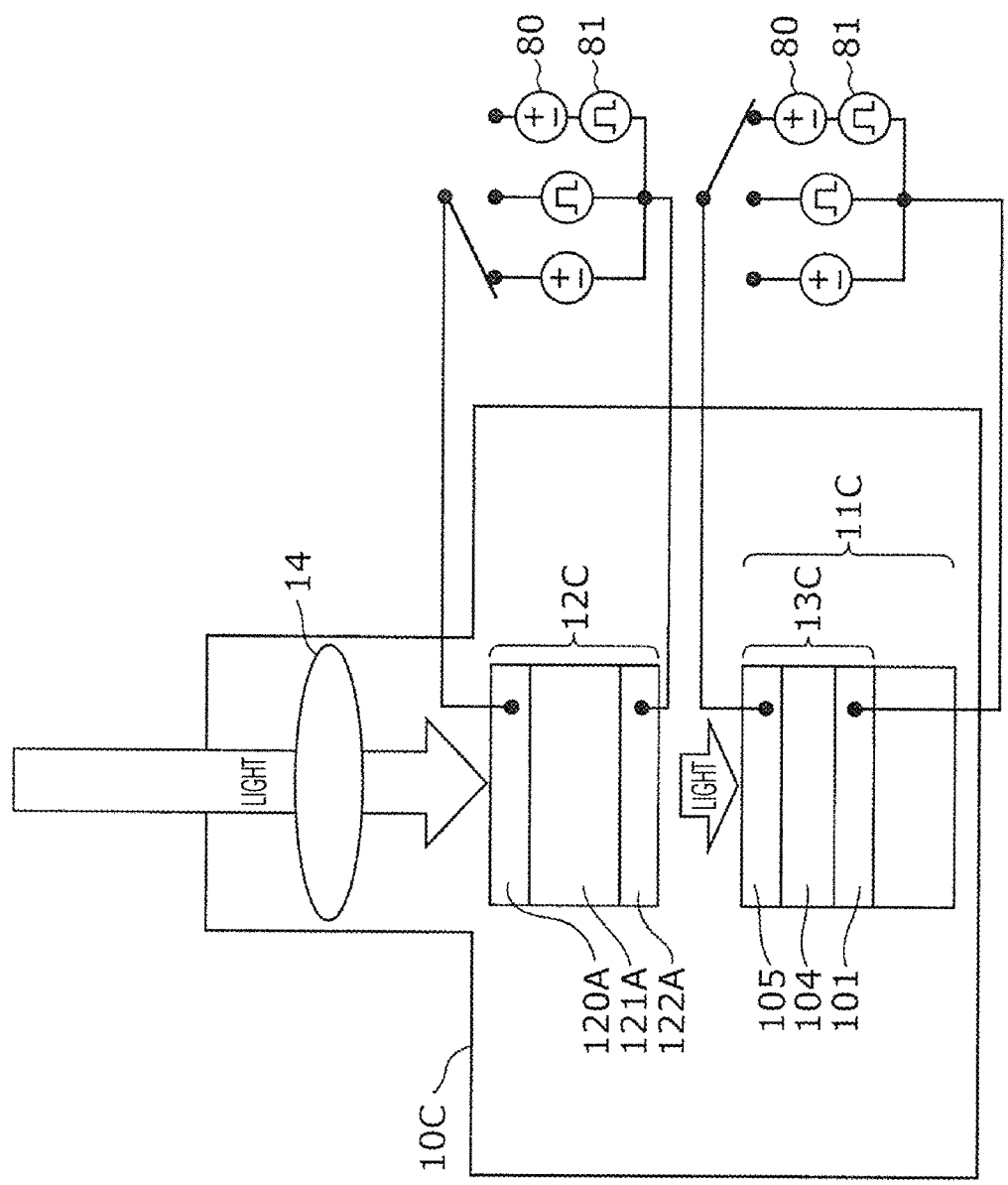
FIG. 18 is a diagram for explaining a sensitivity adjusting method of a first conversion unit and a second conversion unit in the modification 1 of the second embodiment.

The camera system 70D is more specifically explained with reference to FIG. 18. FIG. 18 is a diagram for explaining a sensitivity adjusting method of the first electronic ND filter 12C and the second conversion unit 13C in the camera system 70D according to this modification. In the figure, only components necessary for the explanation are described.

As illustrated in FIG. 18, incident light is made incident on the imaging unit 100 through the lens 14. The light made incident on the imaging unit 100 passes through the first electronic ND filter 12C and is thereafter made incident on the second conversion unit 13C, which is the photoelectric conversion unit, in the light receiving unit 110. The first electronic ND filter 12C is, for example, a liquid crystal-type electronic ND filter.

In the first electronic ND filter 12C, an applied voltage of the voltage power supply 80 is controlled by the applied-voltage control unit 24. Consequently, an attenuation ratio of light made incident on the first electronic ND filter 12C is adjusted.

The pulse-duty control unit 29 controls a voltage value and a duty cycle of an output voltage of combined power supply of the voltage power supply 80 and the pulse-duty-voltage power supply 81, for the photoelectric conversion unit, which is the second conversion unit 13C. When the photoelectric conversion unit is caused to function as an electronic ND filter, sensitivity can be quickly adjusted since a voltage in a range where linearity between the applied voltage to the photoelectric conversion unit and the output voltage of the light receiving unit 110 is secured is used. At this time, the usable voltage range is limited. However, the applied voltage can be adjusted so as to correspond to the desired ND value by being converted into a pulse voltage. Consequently, the light sensitivity of the photoelectric conversion unit can be more finely adjusted.

Note that, depending on the ND value selected by the user I/F unit 60, according to necessity, the applied-voltage control unit 24 may adjust the applied voltage to the first electronic ND filter 12C and the pulse-duty control unit 29 may adjust an applied voltage to the photoelectric conversion unit, which is the second conversion unit 13C. In this way, when the photoelectric conversion unit is caused to function as an electronic ND filter, the pulse-duty control unit 29 can reduce a load on the applied-voltage control unit 24 by controlling the applied voltage to the photoelectric conversion unit.

Modification 2 of the Second Embodiment

An overview of a camera system according to a modification 2 of the second embodiment is explained below.

Figure 19:
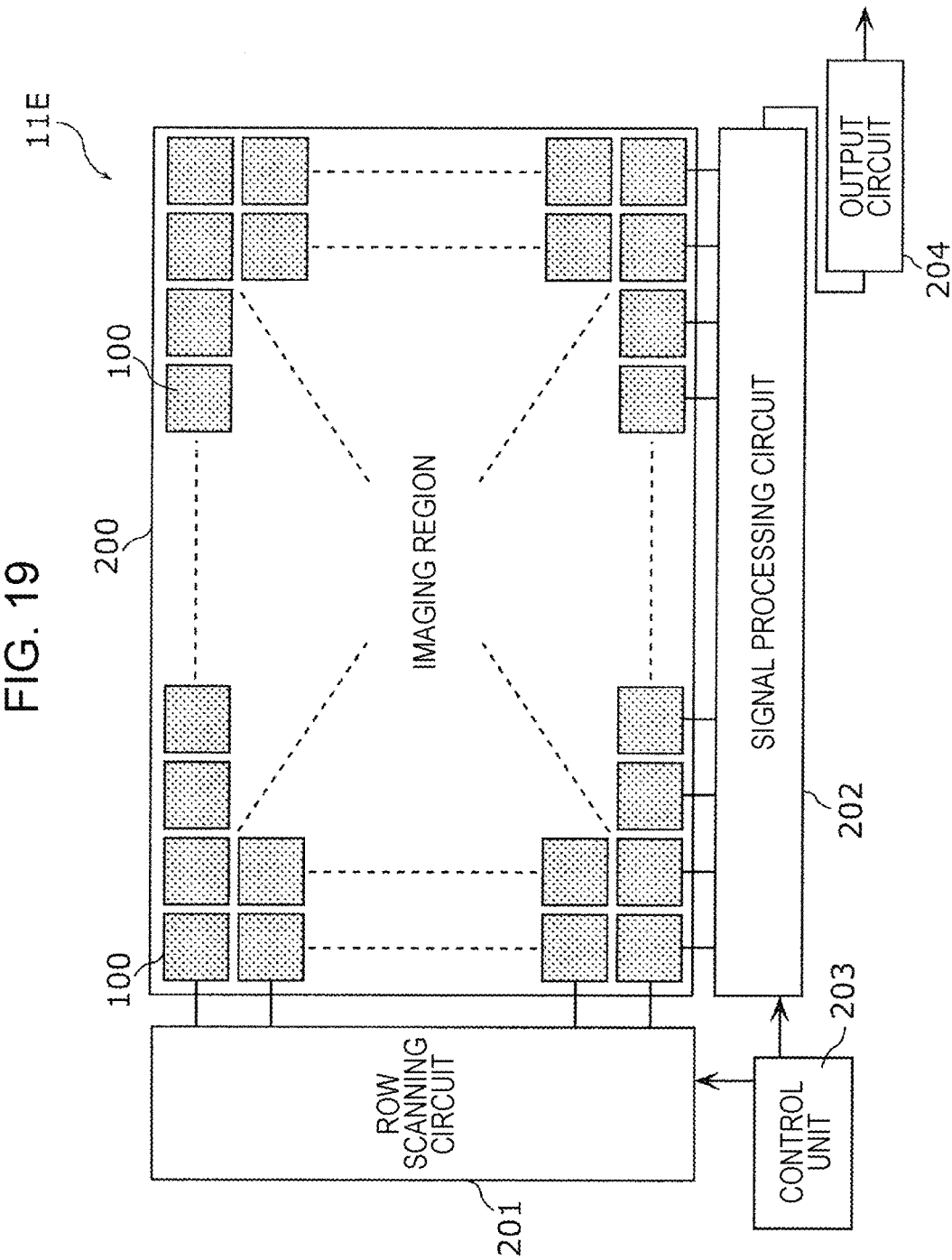
FIG. 19 is a diagram for explaining a light receiving unit in a modification 2 of the second embodiment.

FIG. 19 is a diagram for explaining a light receiving unit 11E according to this modification. The light receiving unit 11E in this modification includes, as illustrated in FIG. 19, a plurality of pixels 100 and a peripheral circuit formed on a semiconductor substrate. The pixels 100 include photoelectric conversion units disposed above the semiconductor substrate. For example, the pixels 100 are arranged in a matrix shape of m rows and n columns (m and n are integers equal to or larger than 2) to form an imaging region 200. The peripheral circuit includes a row scanning circuit 201, a signal processing circuit 202, a control unit 203, and an output circuit 204. The row scanning circuit 201 reads out respective pixel signals and performs scanning. The signal processing circuit 202 performs signal processing of the read-out pixel signal. The control unit 203 generates control signals for controlling the row scanning circuit 201 and the signal processing circuit 202. The output circuit 204 outputs a signal of the signal processing circuit 202.

The camera system according to this modification is common to the camera system 70C according to the second embodiment and a camera system 70G (see FIG. 25) according to a third embodiment in that the photoelectric conversion unit functions as an electronic ND filter. However, an electrode structure of the photoelectric conversion unit is different.

Figure 20:
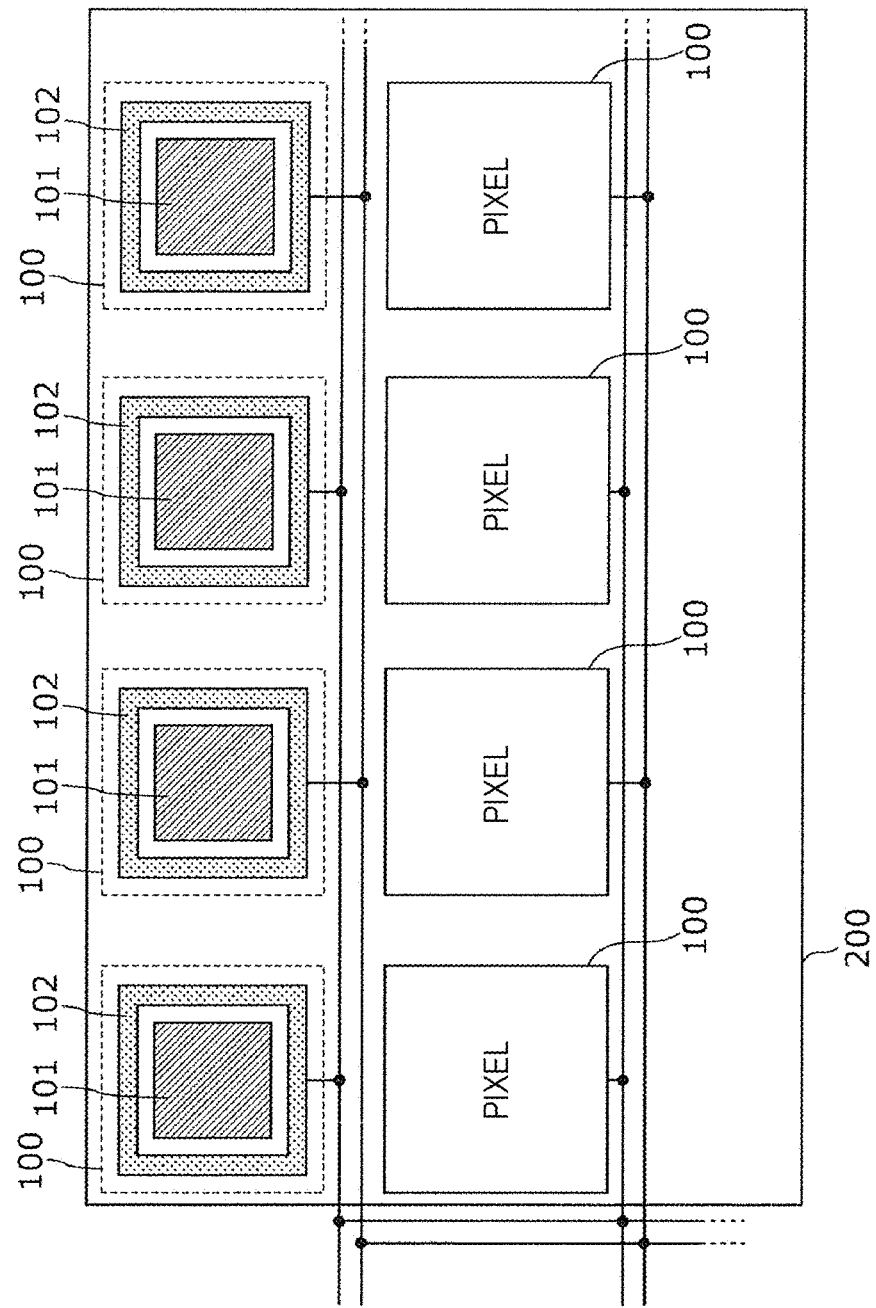
FIG. 20 is a diagram for explaining the configuration of a photoelectric conversion unit in the modification 2 of the second embodiment.

FIG. 20 is a diagram for explaining the configuration of the photoelectric conversion unit in this modification. Note that, in the figure, for simplification of explanation, only different components are described.

As illustrated in FIG. 20, the photoelectric conversion unit in this modification is different from the photoelectric conversion unit in the second embodiment and the third embodiment in that the photoelectric conversion unit includes a third electrode 102 disposed to surround the periphery of the pixel electrode 101 in the pixel 100.

Figure 21:
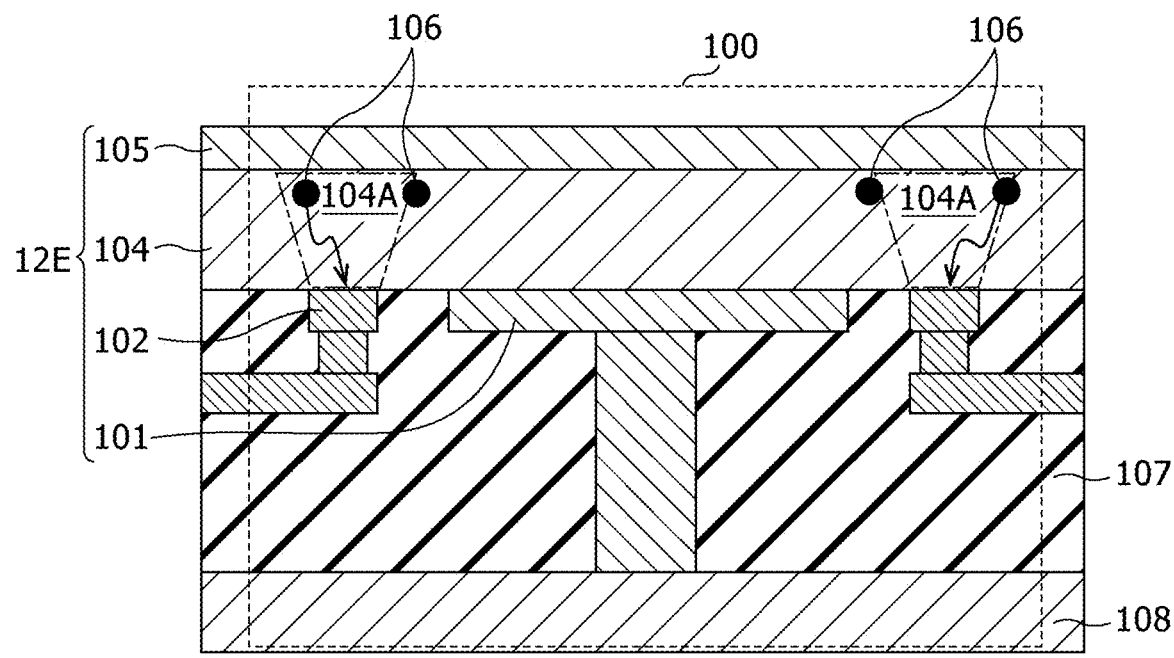
FIG. 21 is a diagram for explaining a sensitivity adjusting method of the photoelectric conversion unit in the modification 2 of the second embodiment.
Figure 22:
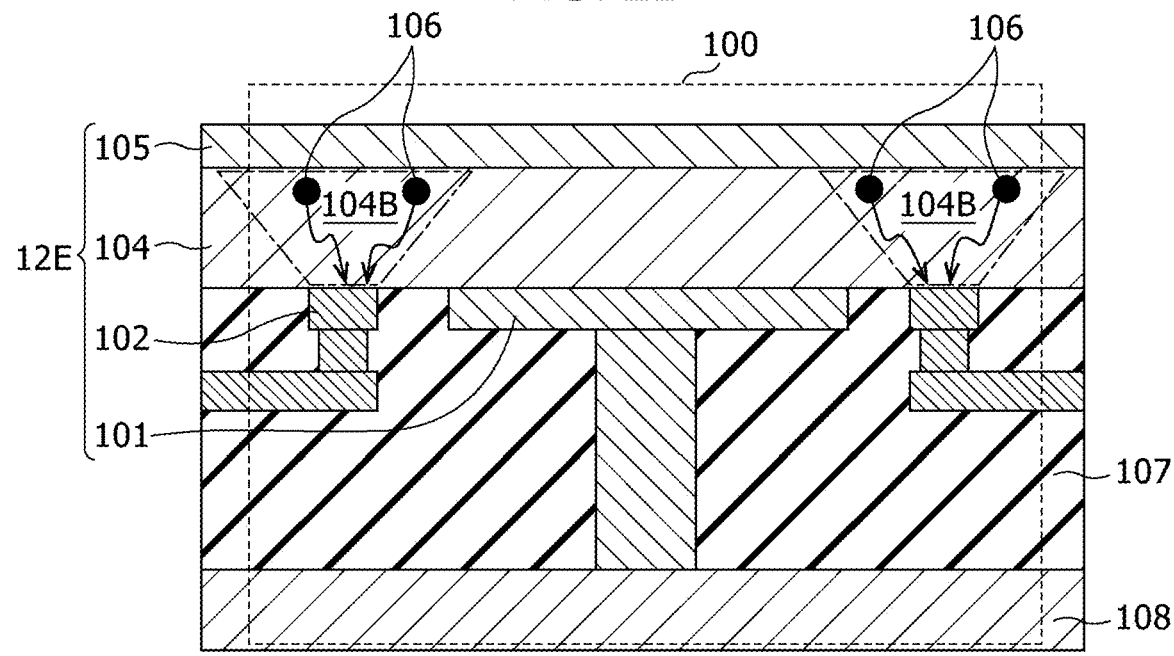
FIG. 22 is a diagram for explaining the sensitivity adjusting method of the photoelectric conversion unit in the modification 2 of the second embodiment.

A sensitivity adjusting method of the photoelectric conversion unit in this modification is explained below. FIGS. 21 and 22 are diagrams for explaining the sensitivity adjusting method of the photoelectric conversion unit in this modification.

In the camera system according to the modification 2 of the second embodiment, the light receiving unit 11E may further include the third electrode 102 for applying a voltage to the photoelectric conversion layer 104. The applied-voltage control unit 24 (not illustrated in FIGS. 21 and 22) may change a voltage applied to the third electrode 102 according to necessary quantum efficiency.

As illustrated in FIG. 21, the pixel 100 includes the counter electrode 105, the photoelectric conversion layer 104, the pixel electrode 101, the third electrode 102 disposed to surround the periphery of the pixel electrode 101, an interlayer insulation layer 107 in which wires are disposed, and a semiconductor substrate 108 on which a readout circuit is disposed, in that order from a light incident side. The third electrode 102 is also referred to as auxiliary electrode.

A photoelectric conversion unit 12E is configured from the counter electrode 105, the photoelectric conversion layer 104, the pixel electrode 101, and the third electrode 102. Light sensitivity of the photoelectric conversion unit 12E is adjusted according to a relation between the strength of an electric field generated by a potential difference between the pixel electrode 101 and the counter electrode 105 and the strength of an electric field generated by a potential difference between the third electrode 102 and the counter electrode 105.

For example, when there is no potential difference between the third electrode 102 and the counter electrode 105, a region where the third electrode 102 can capture electric charges 106 is small (a region 104A). Therefore, the electric charges 106 generated in the photoelectric conversion layer 104 near the third electrode 102 are not captured by the third electrode 102 and flow into the pixel electrode 101. Therefore, the electric charges 106 contribute to the light sensitivity of the photoelectric conversion unit 12E.

On the other hand, as illustrated in FIG. 22, when there is a potential difference between the third electrode 102 and the counter electrode 105, the region (i.e., a region 104B) where the third electrode 102 can capture the electric charges 106 expands according to an increase in the potential difference. Therefore, more electric charges 106 generated in the photoelectric conversion layer 104 near the third electrode 102 are captured compared with when the potential difference is small. Therefore the light sensitivity of the photoelectric conversion unit 12E decreases.

An amount of the captured electric charges 106 is proportional to the strength of the electric field generated by the potential difference between the third electrode 102 and the counter electrode 105. That is, the light sensitivity of the photoelectric conversion unit 12E is adjusted by a voltage of the third electrode 102. For example, when the voltage of the third electrode 102 is raised, the light sensitivity of the photoelectric conversion unit 12E can be improved. When the voltage of the third electrode 102 is lowered, the light sensitivity of the photoelectric conversion unit 12E can be reduced.

As explained above, the camera system according to the modification 2 of the second embodiment can adjust the light sensitivity of the photoelectric conversion unit by adjusting the applied voltage to the third electrode 102. Consequently, the sensitivity of the light receiving unit 11E is optimized. A dynamic range is expanded.

Modification 3 of the Second Embodiment

Figure 23:
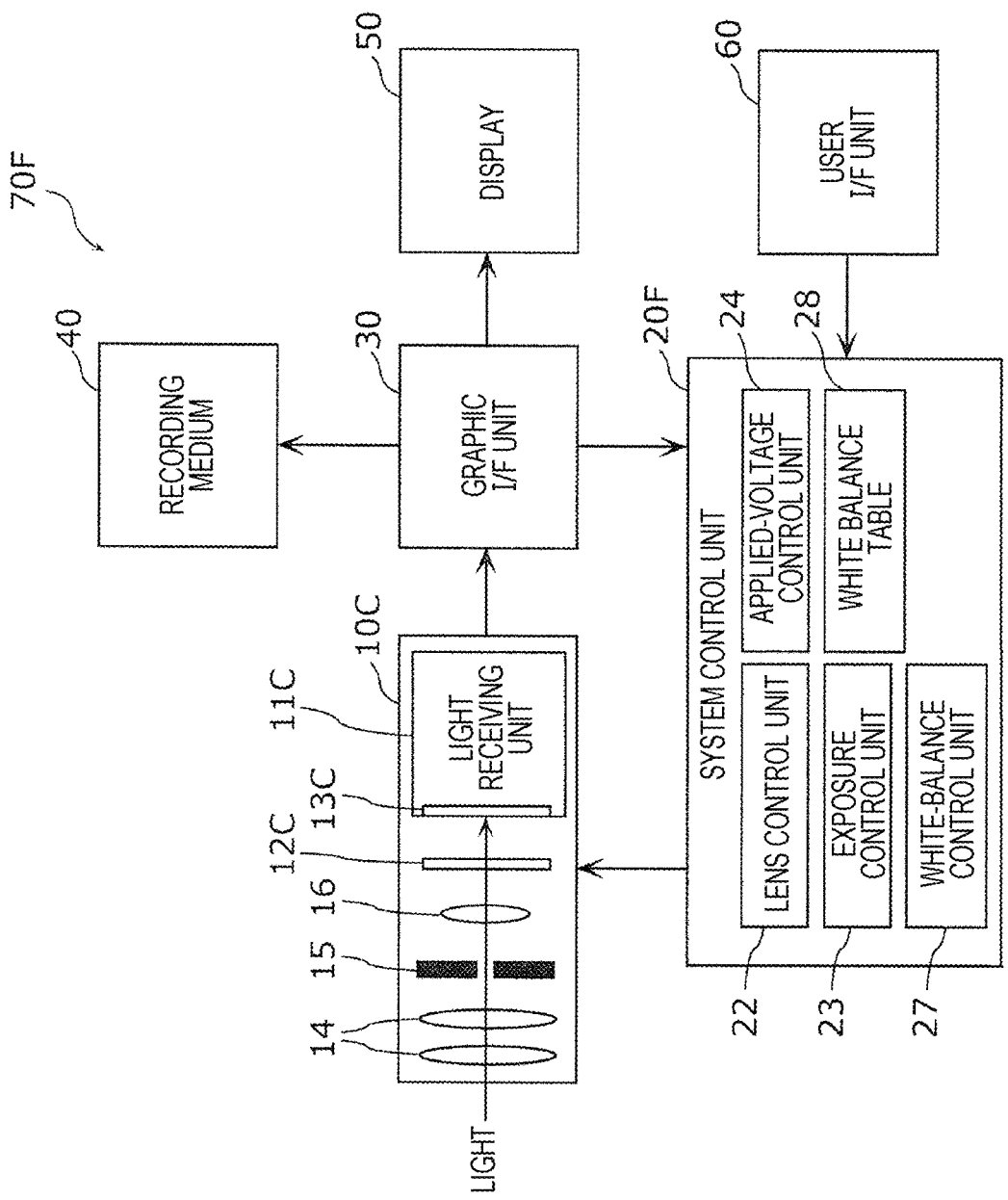
FIG. 23 is a functional block diagram illustrating the configuration of a camera system according to a modification 3 of the second embodiment.

A camera system according to a modification 3 of the second embodiment is explained. FIG. 23 is a functional block diagram illustrating the configuration of a camera system 70F according to this modification. Only differences from the camera system 70C according to the second embodiment are explained.

The camera system 70F according to this modification may further include a white-balance control unit 27. The white-balance control unit 27 adjusts a white balance of an electric signal converted by the light receiving unit 11C, according to a voltage applied to the photoelectric conversion unit. In this modification, the photoelectric conversion unit is a photoelectric conversion unit in the light receiving unit 11C.

As illustrated in FIG. 23, the camera system 70F according to this modification is different from the camera system 70C according to the second embodiment and the camera system 70D according to the modification 1 of the second embodiment in that the camera system 70F includes the white-balance control unit 27 and a white balance table 28 in a system control unit 20F.

Control of a white balance is necessary when light sensitivity is adjusted by adjusting an applied voltage to the photoelectric conversion unit. For example, the control of the white balance is necessary when the photoelectric conversion unit in the light receiving unit 11C is caused to function as a second conversion unit as in this modification.

The control of the white balance is specifically explained below. FIG. 24 is a graph illustrating a relation between an applied voltage to the photoelectric conversion unit and a spectral characteristic.

As illustrated in FIG. 24, as the applied voltage to the photoelectric conversion unit is higher, quantum efficiency of the photoelectric conversion unit is higher. However, a difference in the quantum efficiency occurs among wavelength regions of lights of red (R), green (G), and blue (B), depending on a magnitude of a voltage value of the applied voltage to the photoelectric conversion unit. For example, in the graph of FIG. 24 according to the highest applied voltage, the quantum efficiency of the wavelength region of blue (B) is high. The quantum efficiency of the wavelength region of green (G) and the quantum efficiency of the wavelength region of red (R) are the same degree. In this case, an obtained image has a bluish tone unless the white balance is adjusted. On the other hand, in the graph of FIG. 24 according to the lowest applied voltage, the quantum efficiency of the wavelength region of red (R) is high and the quantum efficiency of the wavelength region of blue (B) is low. In this case, an obtained image has a reddish tone unless the white balance is adjusted.

In this way, the quantum efficiency of the wavelength region of red (R), the quantum efficiency of the wavelength region of green (G), and the quantum efficiency of the wavelength region of blue (B) are different from one another according to a magnitude of the applied voltage to the photoelectric conversion. Therefore, it is necessary to adjust the white balance by adjusting light sensitivity in each wavelength regions.

As illustrated in FIG. 24, a spectral characteristic of the photoelectric conversion unit changes according to a magnitude of the applied voltage to the photoelectric conversion unit. The white-balance control unit 27 is a circuit for correcting the characteristic of the photoelectric conversion unit.

In the white balance table 28, applied voltages and coefficients are saved as a table such that image signals of RGB can be respectively multiplied by the coefficients to keep the white balance even if the applied voltage changes. As another method, the white-balance control unit 27 may store a function to obtain the above coefficients. The white balance of RGB may be kept constant by using the function even if the applied voltage to the photoelectric conversion unit changes to obtain a desired transmittance.

Consequently, in this modification, even if the applied voltage to the photoelectric conversion unit changes, the white balance can be adjusted by the function saved in the white-balance control unit 27. Alternatively, the white balance can be adjusted by causing the white-balance control unit 27 and the white balance table 28 to mutually function. Therefore, it is possible to control the white balance of pixel signals of RGB, variably control the sensitivity of the light receiving unit 11A, and capture a satisfactory image. Because optimum sensitivity adjustment is possible for each color, it is possible to capture a color image having a satisfactory white balance.

The white balance table 28 does not need to be disposed in the system control unit 20F and may be disposed in another place such as the recording medium 40. Note that, as explained above in the modification 1 of the second embodiment, when the photoelectric conversion unit in the light receiving unit 11C is caused to function as the electronic ND filter, the camera system 70F may include the pulse-duty control unit 29 (see FIG. 17). The light sensitivity of the photoelectric conversion unit can be more finely adjusted by converting a voltage applied to the photoelectric conversion unit into pulse voltage.

Third Embodiment

Figure 25:
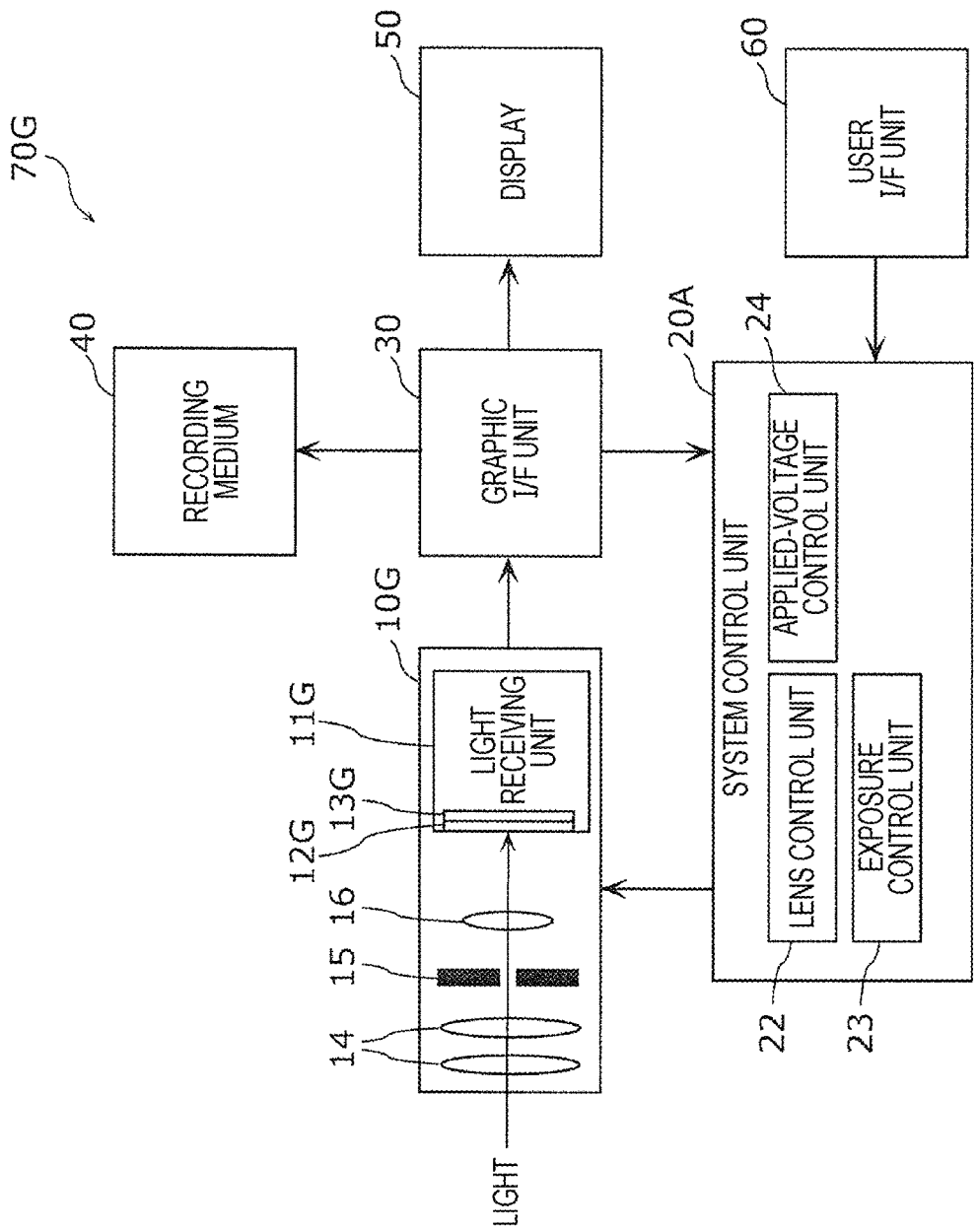
FIG. 25 is a functional block diagram illustrating the configuration of a camera system according to a third embodiment.

An overview of a camera system according to a third embodiment is explained. FIG. 25 is a functional block diagram illustrating the configuration of the camera system 70G according to this embodiment. Note that, in FIG. 25, only components different from the components of the camera system 70A according to the first embodiment and the camera system 70C according to the second embodiment are denoted by different reference numerals and signs.

In the camera system 70G according to this embodiment, a light receiving unit 11G may include a first photoelectric conversion unit including a first photoelectric conversion layer that converts incident light into an electric signal and two first electrodes that sandwich the first photoelectric conversion layer. The light receiving unit 11G may include a second photoelectric conversion unit including a second photoelectric conversion layer that receives light passed through a first conversion unit 12G as incident light and converts the incident light into an electric signal and two electrodes that sandwich the second photoelectric conversion layer. The first photoelectric conversion unit may function as the first conversion unit 12G and change a gain by changing, according to an applied voltage, quantum efficiency in converting the incident light into the electric signal. The second photoelectric conversion unit may function as a second conversion unit 13G and change a gain by changing, according to the applied voltage, quantum efficiency in converting the incident light into the electric signal.

Note that, in this embodiment, an example is explained in which the camera system 70G includes the first conversion unit 12G and the second conversion unit 13G in the light receiving unit 11G. However, the camera system 70G may further include an electronic ND filter separately from the light receiving unit 11G.

In the following explanation, only components different from the components of the camera system 70A according to the first embodiment and the camera system 70C according to the second embodiment are explained.

As illustrated in FIG. 25, the camera system 70G according to this embodiment is different from the camera system 70A according to the first embodiment and the camera system 70C according to the second embodiment in that the first conversion unit 12G and the second conversion unit 13G are present on the inside of the light receiving unit 11G.

Figure 26:
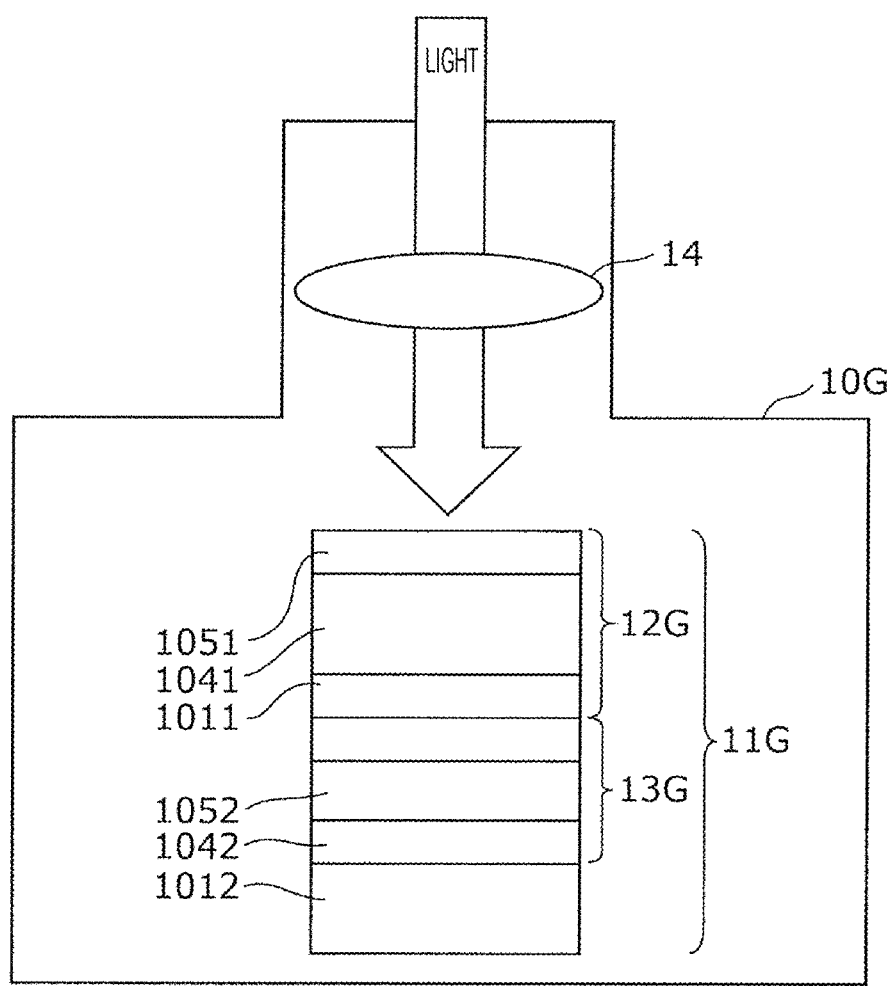
FIG. 26 is a diagram for explaining the configuration of a first conversion unit and a second conversion unit in the camera system according to the third embodiment.

Subsequently, an ND mechanism in the camera system 70G according to this embodiment is explained in detail with reference to FIG. 26. FIG. 26 is a diagram for explaining the configuration of the first conversion unit 12G and the second conversion unit 13G in the camera system 70G according to this embodiment.

As illustrated in FIG. 26, incident light is made incident on an imaging unit 10G through the lens 14. The light made incident on the imaging unit 10G is made incident on the photoelectric conversion unit, which is the first conversion unit 12G in the light receiving unit 11G. The first conversion unit 12G includes a first photoelectric conversion layer 1041 and two first electrodes 1051 and 1011 that sandwich the first photoelectric conversion layer 1041. The first photoelectric conversion layer 1041 converts the light made incident on the first conversion unit 12G into an electric signal. The incident light passed through the first conversion unit 12G is made incident on the photoelectric conversion unit, which is the second conversion unit 13G. The second conversion unit 13G includes a second photoelectric conversion layer 1042 and two second electrodes 1052 and 1012 that sandwich the second photoelectric conversion layer 1042. The second photoelectric conversion layer 1042 converts the light made incident on the second conversion unit 13G into an electric signal.

Figure 27:
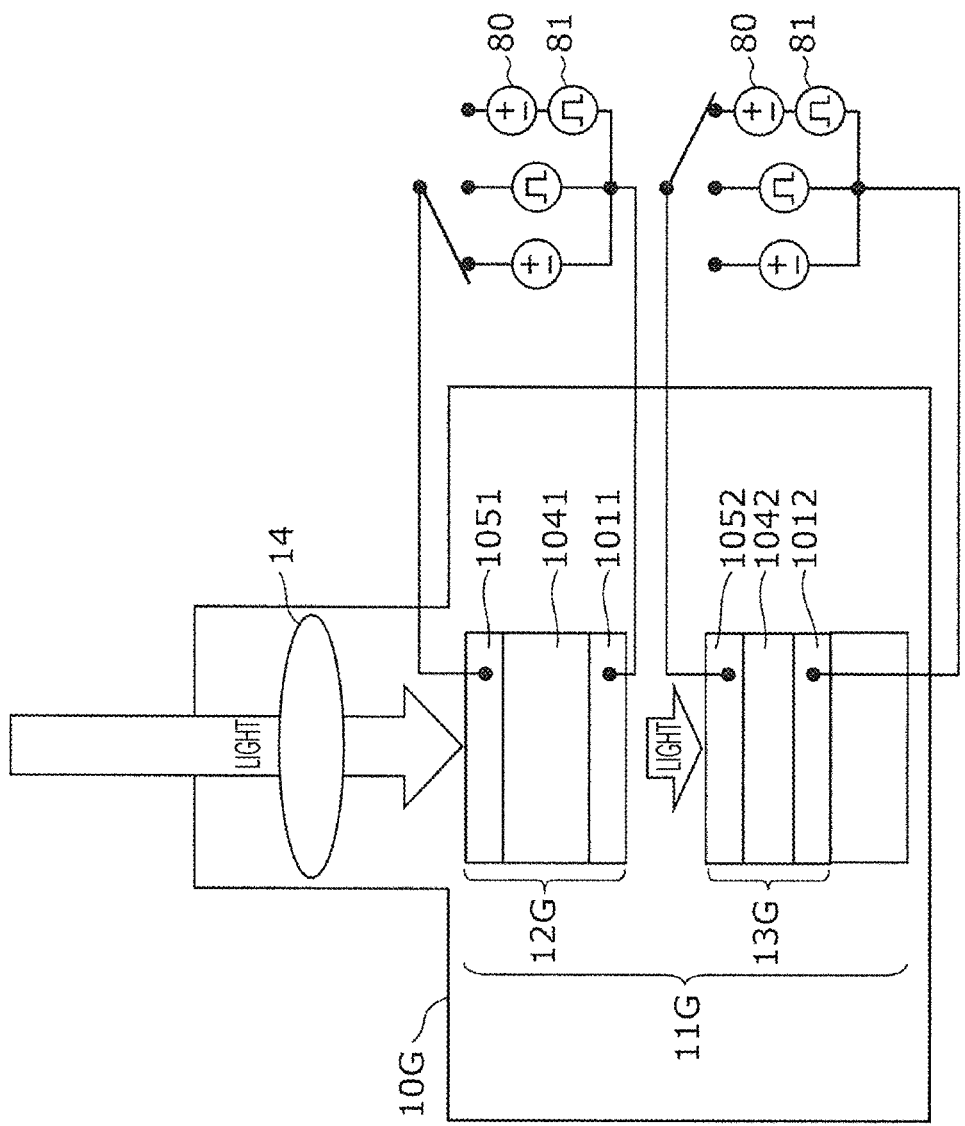
FIG. 27 is a diagram for explaining a sensitivity adjusting method of the first conversion unit and the second conversion unit in the third embodiment.

In this embodiment, a conversion ratio from light into electricity is changed by changing quantum efficiency of these two photoelectric conversion units. The photoelectric conversion units are more specifically explained with reference to FIG. 27. FIG. 27 is a diagram for explaining a sensitivity adjusting method of the first conversion unit 12G and the second conversion unit 13G in this embodiment.

As illustrated in FIG. 27, an applied voltage of the voltage power supply 80 is controlled for the photoelectric conversion unit, which is the first conversion unit 12G, by the applied-voltage control unit 24. As in steps S1 to S3 explained with reference to FIG. 12, the applied-voltage control unit 24 changes the quantum efficiency of the photoelectric conversion unit by adjusting the applied voltage to the photoelectric conversion unit. That is, the applied-voltage control unit 24 adjusts the light sensitivity of the photoelectric conversion unit by applying a voltage corresponding to the desired ND value to the photoelectric conversion unit. For example, when the light sensitivity is adjusted by the voltage control scheme illustrated in FIGS. 13 and 14, in a voltage range where linearity is secured between the applied voltage to the photoelectric conversion unit and the output voltage, the light sensitivity of the photoelectric conversion unit can be easily adjusted by adjusting the magnitude of the applied voltage to the photoelectric conversion unit. Note that, in the voltage range where the linearity is secured, the light sensitivity of the photoelectric conversion unit can be more quickly adjusted by adjusting the magnitude of the applied voltage to the photoelectric conversion unit than by converting the applied voltage into pulse voltage as described later.

The applied-voltage control unit 24 controls an applied voltage and duty cycle of a combined power supply of the voltage power supply 80 and the pulse-duty-voltage power supply 81. The voltage output from the power supply is provided to the photoelectric conversion unit, which is the second conversion unit 13G. As in steps S5 to S7 and steps S9 to S10 explained with reference to FIG. 12, the applied-voltage control unit 24 changes the quantum efficiency of the photoelectric conversion unit by adjusting an applied voltage and a duty cycle of the voltage provided to the photoelectric conversion unit. At this time, a voltage corresponding to the desired ND value may be in a voltage range where linearity is not secured between the applied voltage to the photoelectric conversion unit and the output voltage from the light receiving unit 110. In such a case, an applied voltage needs to be converted into a pulse voltage that has a voltage value in a voltage range where linearity is secured. For example, when the light sensitivity is adjusted by the pulse duty control scheme illustrated in FIGS. 15 and 16, the applied voltage can be converted into a pulse voltage having a voltage value in the range where the linearity is secured, for example, a voltage value of 9 V or more, to obtain an applied voltage equivalent to the desired ND value. Consequently, the photoelectric conversion unit can be adjusted to light sensitivity equivalent to the desired ND value. Note that, the light sensitivity of the photoelectric conversion unit can be more finely adjusted by converting an applied voltage to the photoelectric conversion unit into a pulse voltage than by adjusting only a voltage value of an applied voltage.

The imaging device according to the present disclosure is explained above based on the embodiments and the modifications. However, the present disclosure is not limited to the embodiments and the modifications. Various modifications conceived by those skilled in the art applied to the embodiments and the modifications and other forms constructed by combining a part of the constituent elements in the embodiments and the modifications are also included in the scope of the present disclosure as long as the modifications and the forms do not deviate from the spirit of the present disclosure.

In the embodiments, a part of the constituent elements may be realized by executing a software program suitable for the constituent elements. The constituent elements may be realized by a program executing unit such as a CPU or a processor reading out and executing a software program recorded in a recording medium such as a hard disk or a semiconductor memory.

The camera system according to the present disclosure can be used in various camera systems such as a digital still camera, a camera for broadcasting/business use, a camera for medical use, a camera for monitoring, an on-vehicle camera, a digital single-lens reflex camera, and a digital mirrorless single-lens reflex camera and sensor systems.

What is claimed is:

1. An imaging device comprising:
   a photoelectric converter including a pixel electrode, a counter electrode, and a photoelectric conversion layer between the pixel electrode and the counter electrode, the photoelectric conversion layer converting incident light into an electric charge; and
   a voltage application circuit that applies a first voltage between the pixel electrode and the counter electrode in a first frame and that applies a second voltage between the pixel electrode and the counter electrode in a second frame different from the first frame, the first voltage being a constant voltage, the second voltage being a pulse-shaped voltage, wherein
   the voltage application circuit applies either the first voltage or the second voltage according to a magnitude relation between an attenuation ratio set for each frame and a first value.

2. The imaging device according to claim 1, wherein the voltage application circuit applies the first voltage in a frame set to an attenuation ratio equal to or larger than the first value, and applies the second voltage in a frame set to an attenuation ratio smaller than the first value.

3. The imaging device according to claim 2, wherein the voltage application circuit applies, in the frame set to the attenuation ratio equal to or larger than the first value, the first voltage having a voltage value corresponding to the attenuation ratio.

4. The imaging device according to claim 2, wherein the voltage application circuit applies, in the frame set to the attenuation ratio smaller than the first value, the second voltage having a duty cycle corresponding to the attenuation ratio.

5. The imaging device according to claim 2, wherein the voltage application circuit applies, in the frame set to the attenuation ratio smaller than the first value, the second voltage having a voltage value corresponding to the attenuation ratio and a duty cycle corresponding to the attenuation ratio.

6. The imaging device according to claim 1, wherein the attenuation ratio indicates a ratio of an amount of attenuated light to an amount of incident light.

7. An imaging device comprising:
a photoelectric converter including a pixel electrode, a counter electrode, and a photoelectric conversion layer between the pixel electrode and the counter electrode, the photoelectric conversion layer converting incident light into an electric charge;
a voltage application circuit that applies a first voltage between the pixel electrode and the counter electrode in a first frame and that applies a second voltage between the pixel electrode and the counter electrode in a second frame different from the first frame, the first voltage being a constant voltage, the second voltage being a pulse-shaped voltage; and
a controller that switches an automatic mode for changing, according to intensity of the incident light, a voltage applied between the pixel electrode and the counter electrode by the voltage application circuit, and a manual mode for changing, according to an instruction from a user, a voltage applied between the pixel electrode and the counter electrode by the voltage application circuit.

8. An imaging device comprising:
a photoelectric converter including a photoelectric conversion layer that includes a first surface and a second surface opposite to the first surface and that converts incident light into an electric charge, a pixel electrode on the first surface, a counter electrode on the second surface, and an auxiliary electrode on the second surface; and
a voltage application circuit that applies a first voltage between the pixel electrode and the auxiliary electrode in a first frame and that applies a second voltage between the pixel electrode and the auxiliary electrode in a second frame different from the first frame, the first voltage being a constant voltage, the second voltage being a pulse-shaped voltage.

9. The imaging device according to claim 8, wherein the voltage application circuit applies either the first voltage or the second voltage according to an attenuation ratio set for each frame.

10. The imaging device according to claim 9, wherein the voltage application circuit applies the first voltage in a frame set to an attenuation ratio equal to or larger than a first value, and applies the second voltage in a frame set to an ND value smaller than the first value.

11. The imaging device according to claim 10, wherein the voltage application circuit applies, in the frame set to the attenuation ratio equal to or larger than the first value, the first voltage having a voltage value corresponding to the attenuation ratio.

12. The imaging device according to claim 10, wherein the voltage application circuit applies, in the frame set to the attenuation ratio smaller than the first value, the second voltage having duty cycle corresponding to the attenuation ratio.

13. The imaging device according to claim 10, wherein the voltage application circuit applies, in the frame set to the attenuation ratio smaller than the first value, the second voltage having a voltage value corresponding to the attenuation ratio and duty cycle corresponding to the attenuation ratio.

14. The imaging device according to claim 9, wherein the attenuation ratio indicates a ratio of an amount of attenuated light to an amount of incident light.

15. The imaging device according to claim 8, further comprising a controller that switches an automatic mode for changing, according to intensity of the incident light, a voltage applied between the pixel electrode and the auxiliary electrode by the voltage application circuit, and a manual mode for changing, according to an instruction from a user, the voltage applied between the pixel electrode and the auxiliary electrode by the voltage application circuit.

16. A camera system comprising:
the imaging device according to claim 8;
a display; and
a graphic interface unit that causes the display to selectively display a first image for receiving an instruction for continuously changing a sensitivity and a second image for receiving an instruction for changing a sensitivity stepwise.

17. A camera system comprising:
an imaging device comprising:
a photoelectric converter including a pixel electrode, a counter electrode, and a photoelectric conversion layer between the pixel electrode and the counter electrode, the photoelectric conversion layer converting incident light into an electric charge; and
a voltage application circuit that applies a first voltage between the pixel electrode and the counter electrode in a first frame and that applies a second voltage between the pixel electrode and the counter electrode in a second frame different from the first frame, the first voltage being a constant voltage, the second voltage being a pulse-shaped voltage;
a display; and
a graphic interface unit that causes the display to selectively display a first image for receiving an instruction for continuously changing a sensitivity and a second image for receiving an instruction for changing a sensitivity stepwise.

* * * * *